US012772447B2

(12) United States Patent
Suthram et al.

(10) Patent No.: US 12,772,447 B2
(45) Date of Patent: Oct. 20, 2026

(54) LOGIC CIRCUITS USING VERTICAL TRANSISTORS WITH BACKSIDE SOURCE OR DRAIN REGIONS

(71) Applicant: Intel Corporation, Santa Clara, CA (US)

(72) Inventors: Sagar Suthram, Portland, OR (US); Tahir Ghani, Portland, OR (US); Anand S. Murthy, Portland, OR (US); Wilfred Gomes, Portland, OR (US); Pushkar Sharad Ranade, San Jose, CA (US); Abhishek A. Sharma, Portland, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 689 days.

(21) Appl. No.: 18/314,862

(22) Filed: May 10, 2023

(65) Prior Publication Data

US 2023/0422496 A1 Dec. 28, 2023

Related U.S. Application Data

(63) Continuation of application No. PCT/US2022/035274, filed on Jun. 28, 2022.

(51) Int. Cl.
*H10D 84/85* (2025.01)
*H10B 41/10* (2023.01)
(Continued)

(52) U.S. Cl.
CPC ............. *H10B 41/27* (2023.02); *H10B 41/10* (2023.02); *H10B 41/35* (2023.02); *H10B 43/10* (2023.02);
(Continued)

(58) Field of Classification Search
CPC ............. H10D 30/6733–6739; H10D 30/6757
See application file for complete search history.

(56) References Cited

U.S. PATENT DOCUMENTS 5,192,704 A 3/1993 McDavid et al.
5,218,568 A 6/1993 Lin et al.
(Continued)

FOREIGN PATENT DOCUMENTS

CN 104425576 A 3/2015
CN 108110007 A 6/2018
(Continued)

OTHER PUBLICATIONS

Chang et al., "A Thermodynamic Perspective of Negative-Capacitance Field-Effect Transistors" IEEE Journal on Exploratory Solid-State Computational Devices and Circuits; vol. 3; 9 pages (2017).

(Continued)

*Primary Examiner* — William B Partridge
*Assistant Examiner* — Gustavo G Ramallo
(74) *Attorney, Agent, or Firm* — Akona IP PC

(57) ABSTRACT

IC devices with logic circuits using vertical transistors with backside source or drain (S/D) regions, and related assemblies and methods, are disclosed herein. An example vertical transistor includes an elongated structure (e.g., a nanoribbon) of one or more semiconductor materials extending between a first side (e.g., a back side) and an opposing second side (e.g., a front side) of a substrate. The first S/D region of the transistor may be provided at the first side of the substrate, while the second S/D region of the transistor may be provided at the second side, with the channel region of the transistor being the portion of the elongated structure between the first and second S/D regions. Implementing various logic circuits using vertical transistors with backside
(Continued)

S/D regions may provide a promising way to increasing densities of transistors on the limited real estate of semiconductor chips and/or decreasing short-channel effects associated with continuous scaling of IC components.

23 Claims, 19 Drawing Sheets

(51) Int. Cl.

| | |
|---|---|
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |
| ***H10D 30/67*** | (2025.01) |
| ***H10D 62/10*** | (2025.01) |
| ***H10W 20/41*** | (2026.01) |
| ***H10W 20/42*** | (2026.01) |

(52) U.S. Cl.

CPC ............ *H10B 43/27* (2023.02); *H10B 43/35* (2023.02); *H10D 30/6735* (2025.01); *H10D 30/6757* (2025.01); *H10D 62/118* (2025.01); *H10D 84/85* (2025.01); *H10W 20/42* (2026.01); *H10W 20/435* (2026.01)

(56) References Cited

U.S. PATENT DOCUMENTS

| | | | | |
|---|---|---|---|---|
| 5,412,596 | A | 5/1995 | Hoshiba | |
| 5,515,311 | A | 5/1996 | Mihara | |
| 5,523,964 | A | 6/1996 | McMillan et al. | |
| 6,140,672 | A | 10/2000 | Arita et al. | |
| 6,438,021 | B2 | 8/2002 | Kato | |
| 6,455,883 | B2 | 9/2002 | Kato et al. | |
| 6,642,563 | B2 | 11/2003 | Kanaya | |
| 6,809,951 | B2 | 10/2004 | Yamaguchi | |
| 7,187,575 | B2 | 3/2007 | Kijima et al. | |
| 7,514,734 | B2 | 4/2009 | Aggarwal et al. | |
| 7,812,384 | B2 | 10/2010 | Ozaki | |
| 9,679,893 | B2 | 6/2017 | Yan et al. | |
| 9,698,272 | B1 | 7/2017 | Ikeda et al. | |
| 9,842,839 | B1 | 12/2017 | Sills et al. | |
| 10,128,327 | B2 | 11/2018 | Zhang | |
| 11,018,264 | B1 | 5/2021 | Gomes et al. | |
| 11,183,597 | B2 | 11/2021 | Yamazaki | |
| 11,362,215 | B2 | 6/2022 | Sharma et al. | |
| 2002/0006052 | A1 | 1/2002 | Kato et al. | |
| 2002/0043676 | A1 | 4/2002 | Ohtsuka et al. | |
| 2003/0235067 | A1 | 12/2003 | Sakai et al. | |
| 2005/0094457 | A1 | 5/2005 | Chen et al. | |
| 2006/0268597 | A1 | 11/2006 | Sakuma | |
| 2006/0284224 | A1 | 12/2006 | Shuto | |
| 2008/0048226 | A1 | 2/2008 | Heo et al. | |
| 2008/0121956 | A1 | 5/2008 | Kanaya | |
| 2008/0142915 | A1 | 6/2008 | Sashida | |
| 2008/0303119 | A1 | 12/2008 | Watanabe | |
| 2009/0189152 | A1 | 7/2009 | Cho et al. | |
| 2009/0278120 | A1 | 11/2009 | Lee et al. | |
| 2010/0039850 | A1 | 2/2010 | Kitazaki | |
| 2010/0052029 | A1 | 3/2010 | Huang | |
| 2010/0321975 | A1 | 12/2010 | Kimura et al. | |
| 2012/0228615 | A1 | 9/2012 | Uochi | |
| 2012/0314476 | A1 | 12/2012 | Appenzeller et al. | |
| 2013/0075717 | A1 | 3/2013 | Tsang | |
| 2013/0200361 | A1 | 8/2013 | Tsang | |
| 2014/0070289 | A1 | 3/2014 | Tanaka et al. | |
| 2015/0060957 | A1 | 3/2015 | Lee et al. | |
| 2015/0171225 | A1 | 6/2015 | Shi et al. | |
| 2015/0179657 | A1 | 6/2015 | Inumiya | |
| 2015/0279842 | A1 | 10/2015 | Komeda | |
| 2015/0295570 | A1* | 10/2015 | Ohmaru | H10D 86/423 257/43 |
| 2015/0372149 | A1* | 12/2015 | Colinge | H10D 30/6735 257/316 |
| 2016/0027490 | A1 | 1/2016 | Müller | |
| 2017/0053951 | A1 | 2/2017 | Sato | |
| 2017/0103988 | A1 | 4/2017 | Nishida et al. | |
| 2017/0271510 | A1 | 9/2017 | Wang et al. | |
| 2017/0358660 | A1 | 12/2017 | Cheng et al. | |
| 2017/0372957 | A1 | 12/2017 | Cheng et al. | |
| 2018/0102374 | A1 | 4/2018 | Chavan et al. | |
| 2018/0240804 | A1 | 8/2018 | Yoo | |
| 2019/0189357 | A1 | 6/2019 | Chavan et al. | |
| 2019/0326296 | A1 | 10/2019 | Wang et al. | |
| 2019/0371802 | A1 | 12/2019 | Morris et al. | |
| 2020/0006516 | A1 | 1/2020 | Manipatruni et al. | |
| 2020/0075609 | A1 | 3/2020 | Morris et al. | |
| 2020/0185384 | A1 | 6/2020 | Li et al. | |
| 2020/0185385 | A1 | 6/2020 | Juengling | |
| 2020/0194443 | A1 | 6/2020 | Lin et al. | |
| 2020/0219804 | A1* | 7/2020 | Jezewski | H10D 99/00 |
| 2020/0273867 | A1 | 8/2020 | Manipatruni et al. | |
| 2020/0286984 | A1 | 9/2020 | Chang et al. | |
| 2020/0388711 | A1 | 12/2020 | Doyle et al. | |
| 2021/0125990 | A1 | 4/2021 | Gomes et al. | |
| 2021/0134802 | A1 | 5/2021 | Gomes et al. | |
| 2021/0151438 | A1 | 5/2021 | Gomes et al. | |
| 2021/0159229 | A1 | 5/2021 | Gomes et al. | |
| 2021/0202485 | A1 | 7/2021 | Inaba | |
| 2021/0296556 | A1 | 9/2021 | Hsu et al. | |
| 2021/0398991 | A1 | 12/2021 | Manfrini et al. | |
| 2021/0398993 | A1 | 12/2021 | Haratipour et al. | |
| 2022/0189913 | A1 | 6/2022 | Atanasov et al. | |
| 2022/0189957 | A1 | 6/2022 | Atanasov et al. | |

FOREIGN PATENT DOCUMENTS

| | | | |
|---|---|---|---|
| CN | 109148454 | A | 1/2019 |
| CN | 109542839 | A | 3/2019 |
| CN | 113611666 | A | 11/2021 |
| EP | 1265254 | A2 | 12/2002 |
| EP | 2846348 | A1 | 3/2015 |
| EP | 3618070 | A2 | 3/2020 |
| EP | 3629381 | B1 | 8/2022 |
| JP | 3169406 | B2 | 5/2001 |
| JP | 2008153479 | A | 7/2008 |
| JP | 4523115 | B2 | 8/2010 |
| WO | 2017171739 | A1 | 10/2017 |
| WO | 2018111215 | A1 | 6/2018 |
| WO | 2018125024 | A1 | 7/2018 |
| WO | 2018231210 | A1 | 12/2018 |
| WO | 2019074506 | A1 | 4/2019 |
| WO | 2019182597 | A1 | 9/2019 |

OTHER PUBLICATIONS

Chang et al., "Inversion Charge Boost and Transient Steep-Slope Induced by Free-Charge-Polarization Mismatch in a Ferroelectric-Metal-Oxide-Semiconductor Capacitor," IEEE Journal on Exploratory Solid-State Computational Devices and Circuits; vol. 4, No. 2; 6 pages (Dec. 2018).

Chang et al., "Physical Origin of Transient Negative Capacitance in a Ferroelectric Capacitor," Physical Review Applied 9; 8 pages (2018).

Muller, J., et al., "Ferroelectricity in YTTRIUM-Doped Hafnium Oxide," Journal of Applied Physics; vol. 110, No. 11; Dec. 1, 2011 (5 pages).

Sallese, et al., "Principles of the 1-T DRAM Concept on SOI," LEG Laboratory, Swiss Federal Institute of Technology, EPFL, 1015 Lausanne, Switzerland; 19 pages.

Sharma, A., et al., "High Speed Memory Operation in Channel-Last, Back-gated Ferroelectric Transistors," 2020 IEEE International Electron Devices Meeting (IEDM), Dec. 12-18, 2020; downloaded IEEE Xplore Jun. 29, 2021; pp. 18.5.1-18.5-.4.

* cited by examiner

LOGIC CIRCUITS USING VERTICAL TRANSISTORS WITH BACKSIDE SOURCE OR DRAIN REGIONS

CROSS REFERENCE TO RELATED APPLICATIONS

This application is a continuation of (and claims the benefit and priority under 35 U.S.C. 120 of) International Application No. PCT/US2022/035274, filed 28 Jun. 2022, entitled "LOGIC CIRCUITS USING VERTICAL TRANSISTORS WITH BACKSIDE SOURCE OR DRAIN REGIONS," the disclosure of which is considered a part of, and is incorporated by reference in the disclosure of this application.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each contact becomes increasingly significant. Careful design of transistors may help with such an optimization.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1B:
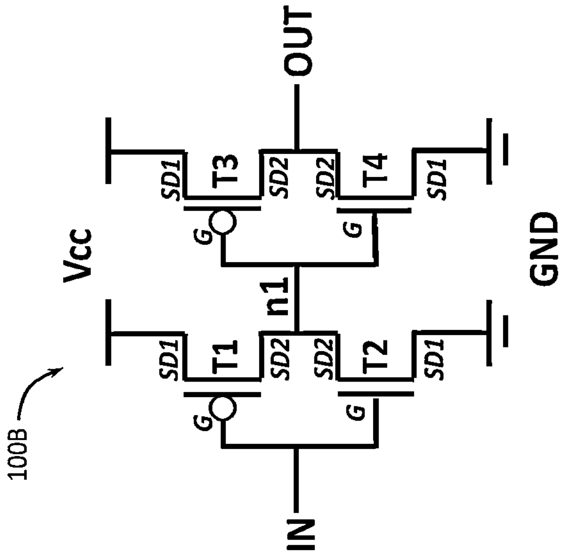
FIGS. 1A-1D provide electric circuit diagrams of logic circuits that may be implemented using vertical transistors with backside source or drain (S/D) regions, in accordance with some embodiments.

IC devices with logic circuits using vertical transistors with backside S/D regions, and related assemblies and methods, are disclosed herein. The devices, assemblies, and methods of this disclosure each have several innovative aspects, no single one of which is solely responsible for all the desirable attributes disclosed herein. Details of one or more implementations of the subject matter described in this specification are set forth in the description below and the accompanying drawings.

For purposes of illustrating logic circuits using vertical transistors with backside S/D regions, proposed herein, it might be useful to first understand phenomena that may come into play in such arrangements. The following foundational information may be viewed as a basis from which the present disclosure may be properly explained. Such information is offered for purposes of explanation only and, accordingly, should not be construed in any way to limit the broad scope of the present disclosure and its potential applications.

A field-effect transistor (FET), e.g., a metal-oxide-semiconductor (MOS) FET (MOSFET), is a three-terminal device that includes source, drain, and gate terminals and uses electric field to control current flowing through the device. A FET typically includes a semiconductor channel material, a source region and a drain region provided in the channel material, and a gate stack that includes at least a gate electrode material and, optionally, also a gate insulator, where the gate stack is provided over a portion of the channel material between the source region and the drain region. Since, as is common in the field of FETs, designations of "source" and "drain" are often interchangeable, source and drain regions of a transistor may be referred to as first and second source or drain (S/D) regions, where, in some embodiments, the first S/D region is a source region and the second S/D region is a drain region and, in other embodiments, the first S/D region is a drain region and the second S/D region is a source region. Analogous applies to S/D contacts/terminals of a transistor.

Recently, FETs with non-planar architectures, such as FinFETs (also sometimes referred to as "wrap around gate transistors" or "tri-gate transistors") and nanoribbon/nanowire transistors (also sometimes referred to as "gate all-around (GAA) transistors"), have been extensively explored as alternatives to transistors with planar architectures.

In a FinFET, an elongated semiconductor structure (e.g., an elongated structure that includes one or more semiconductor materials) shaped as a fin extends away from a base (e.g., from a semiconductor substrate or any suitable support structure). A portion of a fin that is closest to the base may be enclosed by an insulator material. Such an insulator material, typically an oxide, is commonly referred to as a "shallow trench isolation" (STI), and the portion of the fin enclosed by the STI is referred to as a "subfin portion" or simply a "subfin." A gate stack may wrap around an upper portion of the fin (e.g., the portion farthest away from the base). The portion of the fin around which the gate stack wraps is referred to as a "channel region" (or, alternatively, as a "channel portion" or simply a "channel") of a FinFET. A semiconductor material of the channel region is commonly referred to as a "channel material" of the transistor. FinFETs are sometimes referred to as "tri-gate transistors" because, in use, such transistors may form conducting channels on three "sides" of the channel region of the fin. A source region and a drain region are provided in the fin on the opposite sides of the gate stack, forming, respectively, a source and a drain of a FinFET.

In a nanoribbon transistor, a gate stack may be provided around a portion of an elongated semiconductor structure called "nanoribbon", forming a gate on all sides of the nanoribbon. The "channel" or the "channel region" of a nanoribbon transistor is the portion of the nanoribbon around which the gate stack wraps. Such transistors are sometimes referred to as "GAA transistors" because, in use, such transistors may form conducting channels on all "sides" of the channel region of the nanoribbon. A source region and a drain region are provided in the nanoribbon on each side of the gate stack, forming, respectively, a source and a drain of a nanoribbon transistor. In some settings, the term "nanoribbon" has been used to describe an elongated semiconductor structure that has a substantially rectangular transverse cross-section (e.g., a cross-section in a plane perpendicular to the longitudinal axis of the structure), while the term "nanowire" has been used to describe a similar structure but with a substantially circular or square transverse cross-sections. In the following, a single term "nanoribbon transistor" is used to describe all non-planar transistors where a gate stack wraps around substantially all sides of an elongated semiconductor structure, independent of the shape of the transverse cross-section. Thus, as used herein, the term "nanoribbon transistor" is used to cover transistors with elongated semiconductor structures that have substantially rectangular transverse cross-sections (possibly with rounded corners), transistors with elongated semiconductor structures that have substantially square transverse cross-sections (possibly with rounded corners), transistors with elongated semiconductor structures that have substantially circular or elliptical/oval transverse cross-sections, as well as transistors with elongated semiconductor structures that have any polygonal transverse cross-sections.

As the foregoing illustrates, both FinFETs and nanoribbon transistors are built based on elongated semiconductor structures (in the following referred to, simply, as "elongated structures"), e.g., fins or nanoribbons, respectively. A longitudinal axis of such structures may be defined as an axis that includes a line along the direction of carrier transport between source and drain regions of the transistor. Typically, such an axis is substantially parallel to a support structure (e.g., a die, a chip, a substrate, a carrier substrate, or a package substrate) on/in which a transistor resides and is one of lines of symmetry for the elongated structure of the transistor (at least for the idealized version of the transistor that does not reflect unintended manufacturing variations that may affect the real-life geometry of the transistor). In contrast to such conventional implementations, embodiments of the present disclosure relate to non-planar transistors that are built based on elongated structures with longitudinal axes oriented substantially perpendicular to a support structure over which the transistors are provided (i.e., oriented vertically). Such transistors are referred to as "vertical transistors." Some vertical transistor arrangements have been explored in the past. However, in such past implementations, all terminals of a vertical transistor are still contacted from a single surface of a support structure, typically from the front side, and both of the S/D regions of a transistor are near that surface. In contrast, vertical transistors described herein have their source and drain regions on the opposite surfaces of a support structure (i.e., one of a source region and a drain region is at the front side and the other one is at the back side). Therefore, such transistors are referred to as "vertical transistors with backside S/D regions." For example, in one aspect, an example vertical transistor includes an elongated structure (e.g., a nanoribbon) of one or more semiconductor materials extending between a first side (e.g., a back side) and an opposing second side (e.g., a front side) of a substrate. The first S/D region of the transistor may be provided at the first side of the substrate, while the second S/D region of the transistor may be provided at the second side, with the channel region of the transistor being the portion of the elongated structure between the first and second S/D regions. Implementing various logic circuits using vertical transistors with backside S/D regions may provide a promising way to increasing densities of transistors on the limited real estate of semiconductor chips and/or decreasing short-channel effects associated with continuous scaling of IC components.

Embodiments of the present disclosure are further based on recognition that logic circuits using vertical transistors with backside S/D regions may be optimized even further if transistors are to be operated at relatively low temperatures, where, as used herein, low-temperature operation (or "lower-temperature" operation) refers to operation at temperatures below room temperature, e.g., below 200 Kelvin degrees or lower. Thermal energy is much lower at low temperatures and, consequently, the off-current (Ioff) of a transistor is much lower and the subthreshold swing is much sharper, compared to room temperature operation. Consequently, if a transistor is operated at low temperatures, its gate length can be shorter than what can be achieved at room temperatures, while keeping the short-channel effects at a level that does not significantly compromise transistor performance. As a result, at low temperatures, it may be possible to further decrease footprints of transistor arrangements described herein, thereby decreasing their effective gate lengths, while still maintaining adequate performance.

In the following detailed description, various aspects of the illustrative implementations may be described using terms commonly employed by those skilled in the art to convey the substance of their work to others skilled in the art. For example, as used herein, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," "sulfide," etc. refer to compounds containing, respectively, oxygen, carbon, nitrogen, sulfur, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−10%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−8% of a target value, e.g., within +/−5% of a target value or within +/−2% of a target value, based on the context of a particular value as described herein or as known in the art.

The term "interconnect" may refer to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "metal traces," "lines," "metal lines," "wires," "metal wires," "trenches," or "metal trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias. The term "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

The terms "over," "under," "between," and "on" as used herein refer to a relative spatial position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, analogous elements designated in the present drawings with different reference numerals after a dash, e.g., elongated structures 104-1 and 104-2 may be collectively referred to together without the reference numerals after the dash, e.g., as "elongated structures 104." In order to not clutter the drawings, if multiple instances of certain elements are illustrated in a given drawing, only some of the elements may be labeled with a reference sign. A plurality of drawings with the same number and different letters may be referred to without the letters, e.g., FIGS. 2A-2C may be referred to as "FIG. 2."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of IC devices with logic circuits using vertical transistors with backside S/D regions as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with logic circuits using vertical transistors with backside S/D regions as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

FIGS. 1A-1D provide electric circuit diagrams of logic circuits 100A-100D that may be implemented using vertical transistors with backside S/D regions, in accordance with some embodiments. In FIGS. 1A-1D each of the NMOS and PMOS transistors are illustrated using their conventional electric circuit diagram representation with gate, first S/D, and second S/D transistor terminals being labeled as, respectively, G, SD1, and SD2. Each of FIGS. 1A-1D illustrates a logic circuit with four transistors, labeled as transistors T1, T2, T3, and T4, where the transistors T1 and T3 are PMOS transistors and the transistors T2 and T4 are NMOS transistors. The electric circuit diagrams of FIGS. 1A-1D further label example reference potential terminals GND and Vcc, where GND is a first reference potential terminal, representing an electrical connection to the ground voltage, and where Vcc is a second reference potential terminal, representing an electrical connection to a reference voltage that is higher than the ground voltage. The electric circuit diagrams of FIGS. 1A-1D further label various input and output terminals.

Figure 2A:
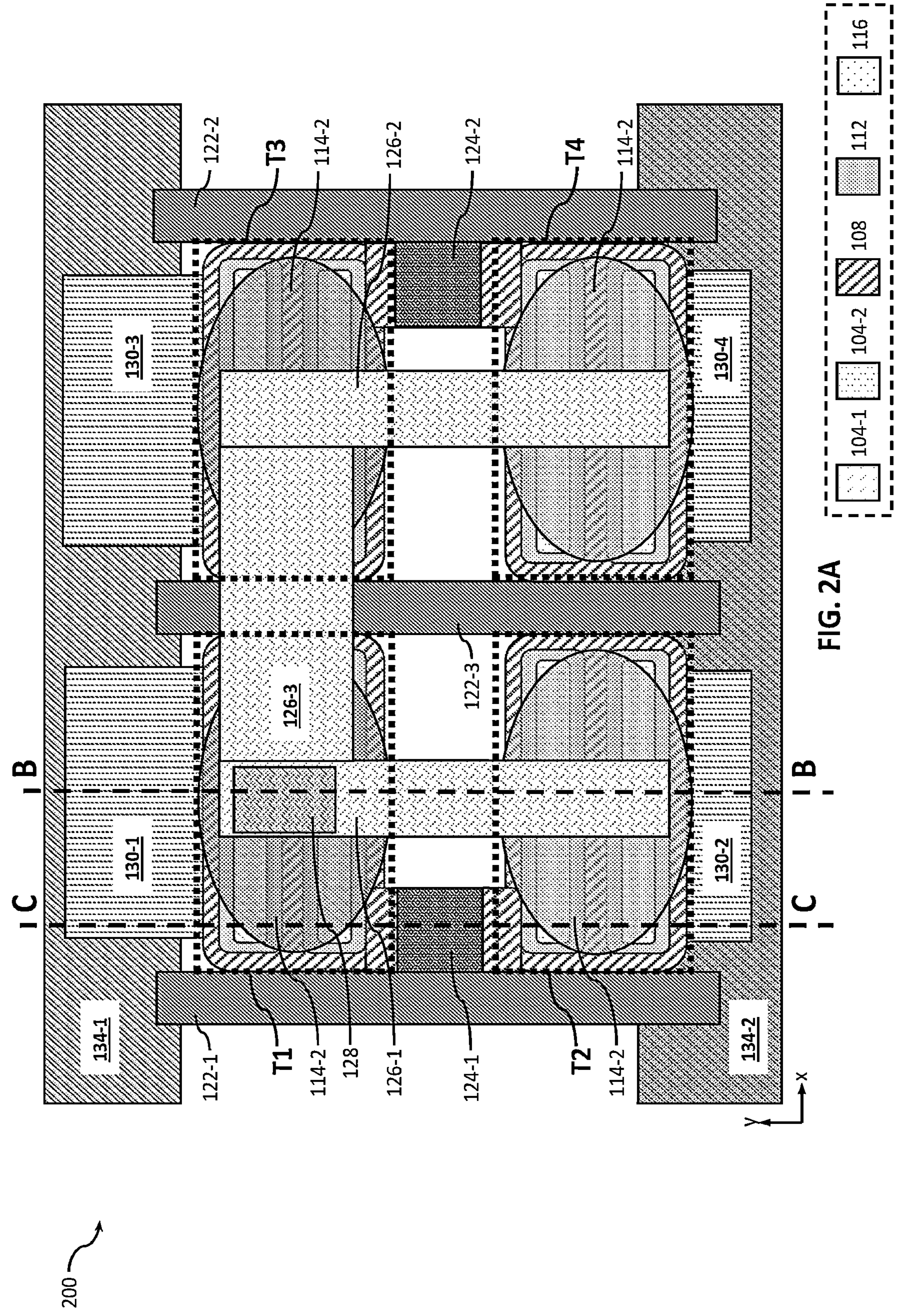
FIGS. 2A-2C provide top-down and cross-sectional side views of an IC device implementing a two-legged inverter circuit using vertical transistors with backside S/D regions, in accordance with some embodiments.
Figure 2B:
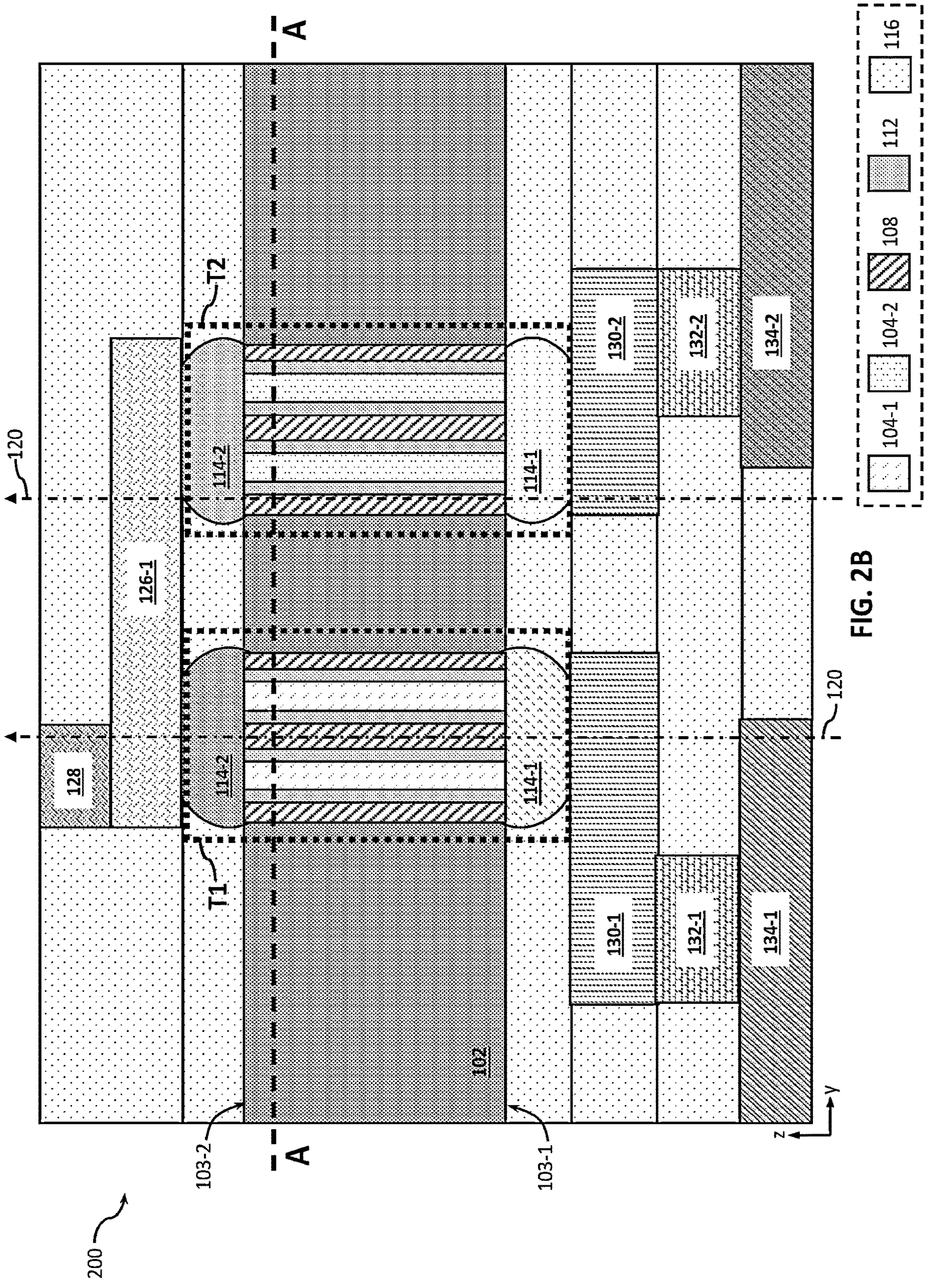
Figure 2C:
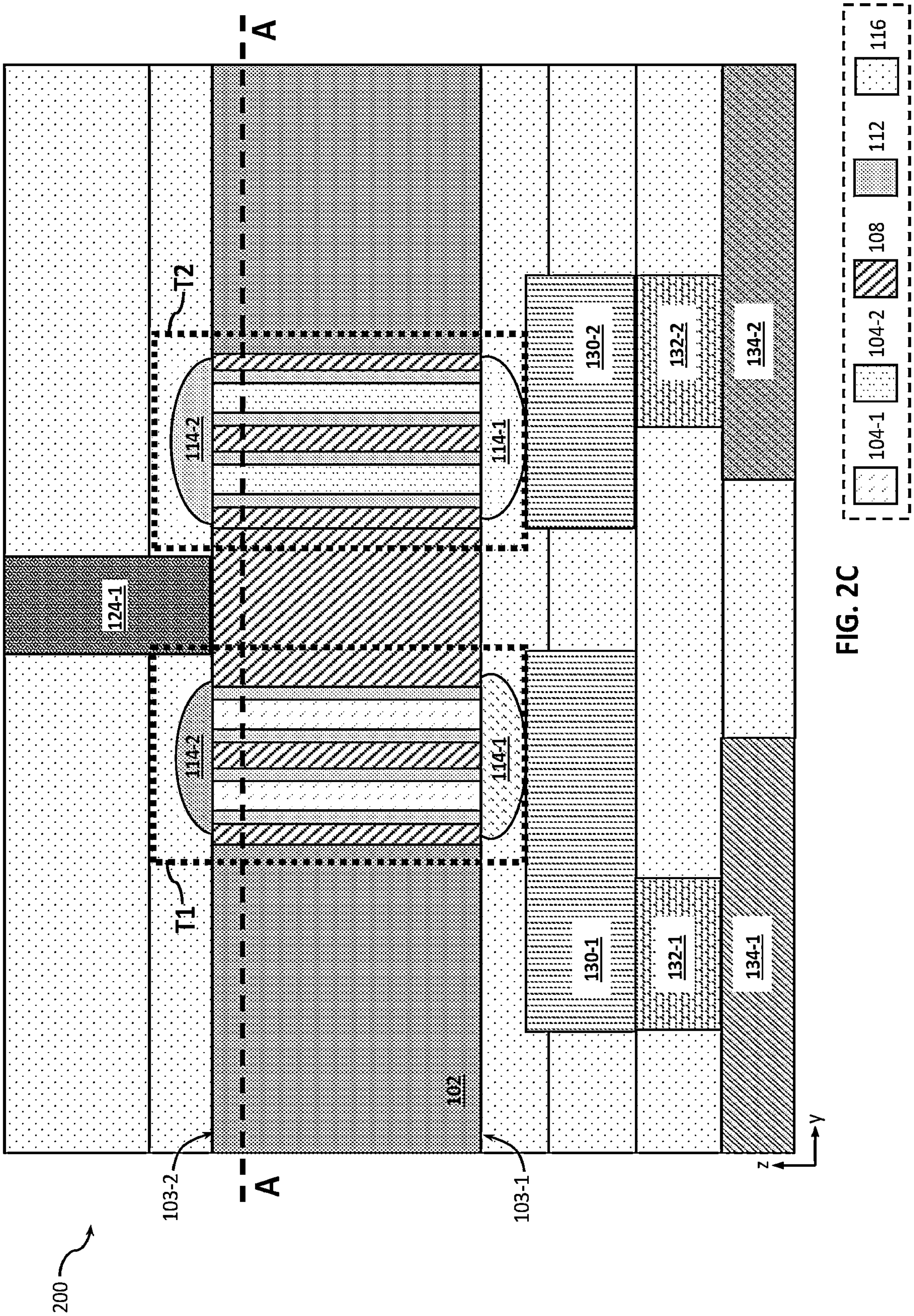
Figure 3A:
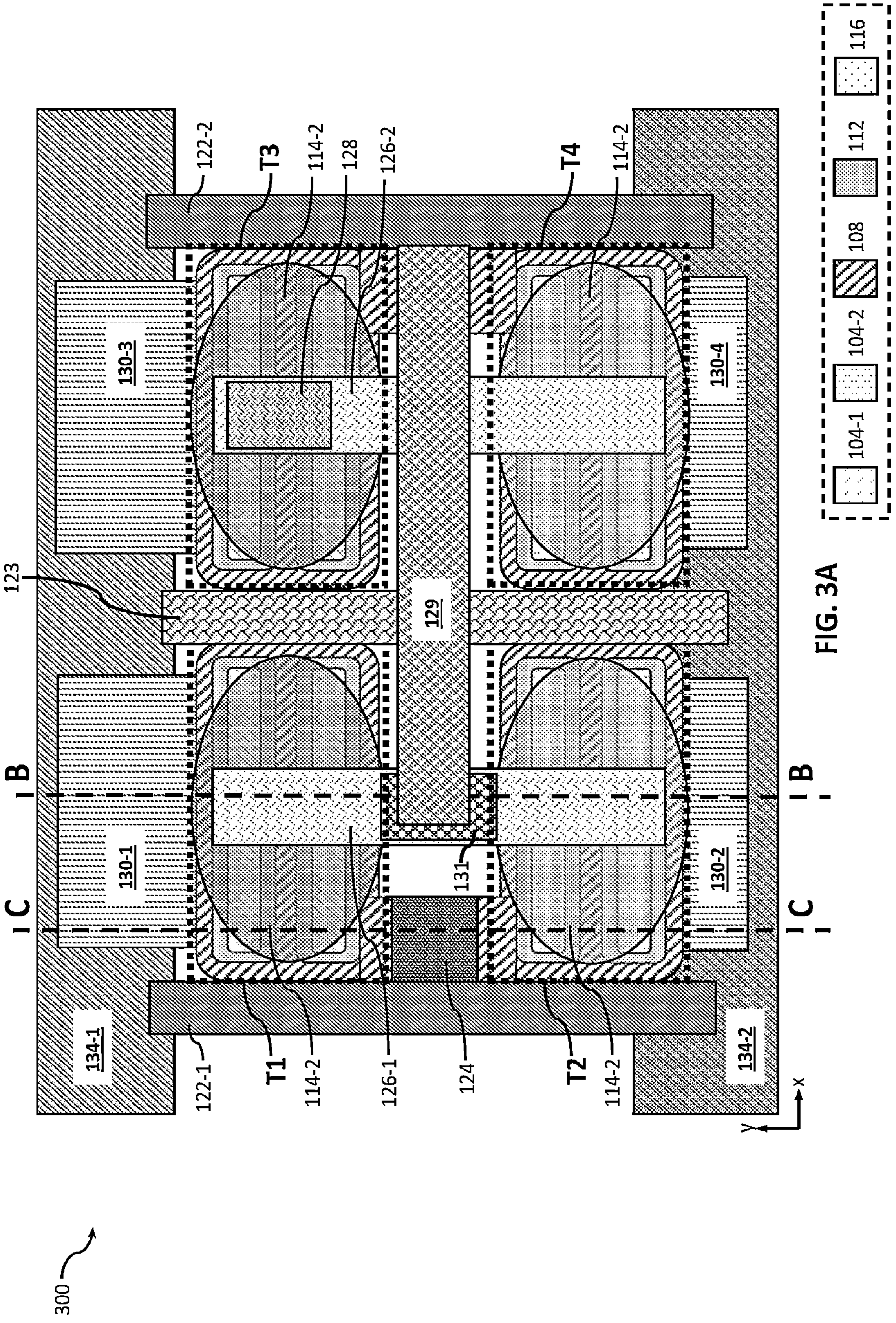
FIGS. 3A-3C provide top-down and cross-sectional side views of an IC device implementing a buffer circuit using vertical transistors with backside S/D regions, in accordance with some embodiments.
Figure 3B:
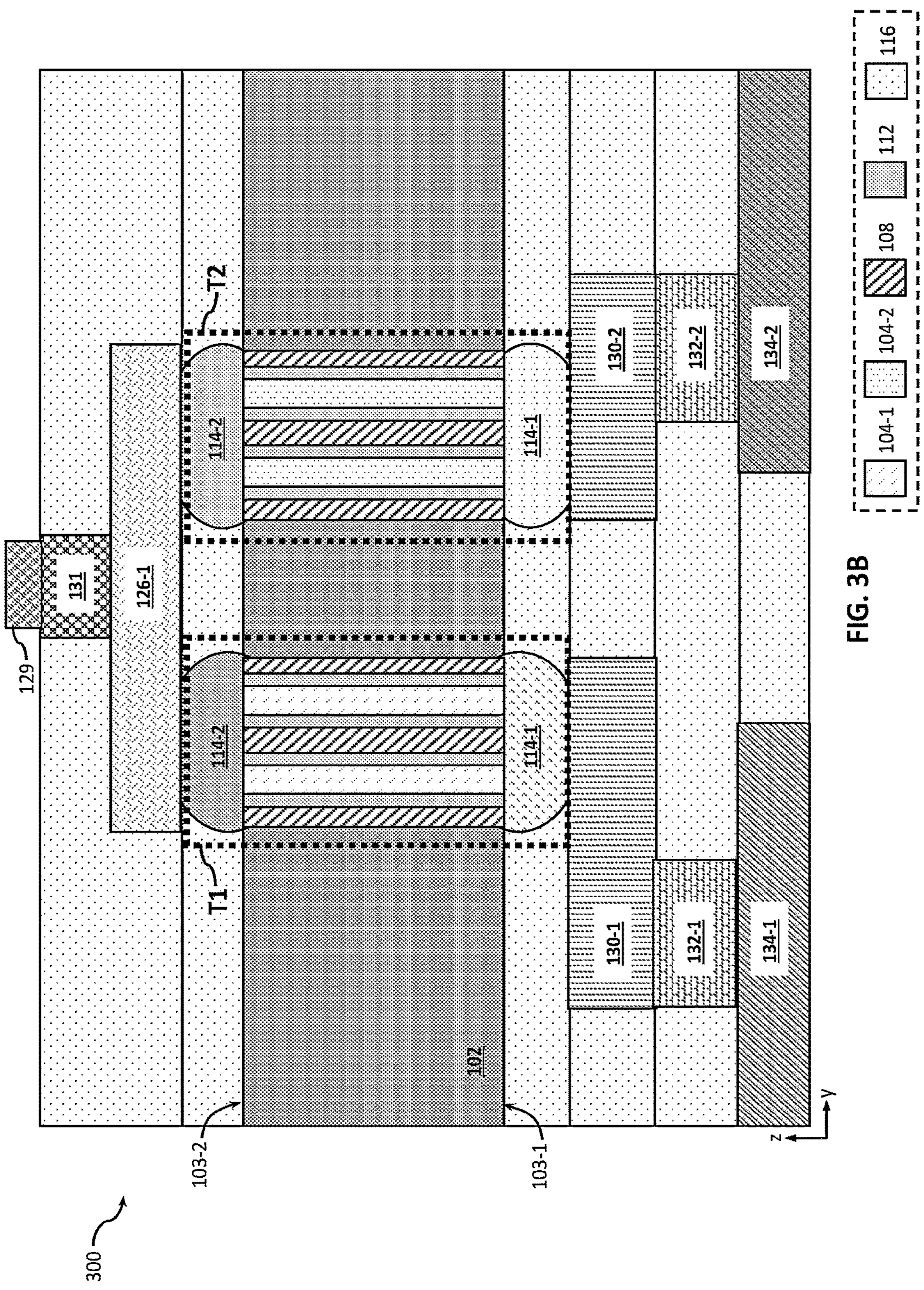
Figure 3C:
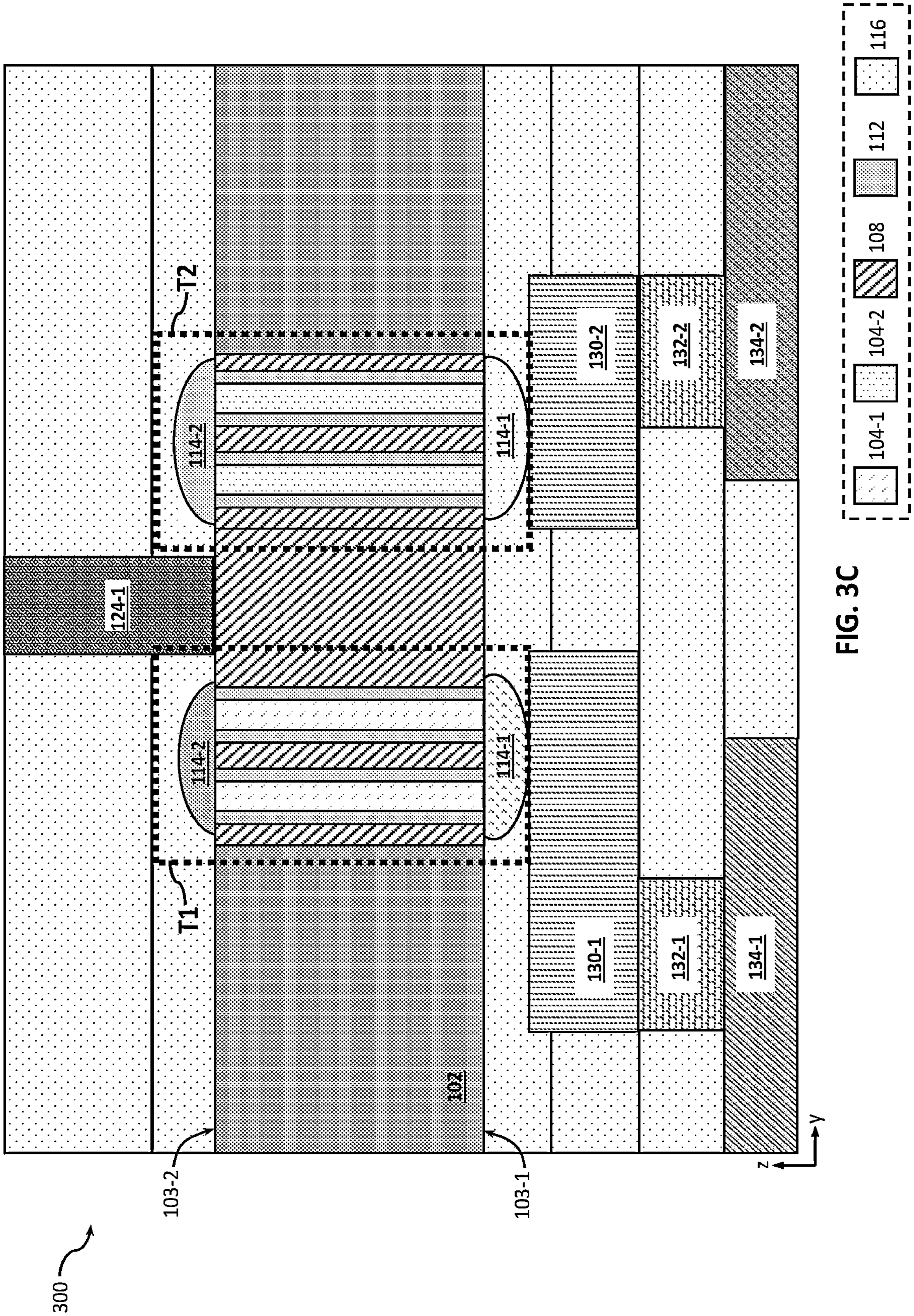
Figure 4A:
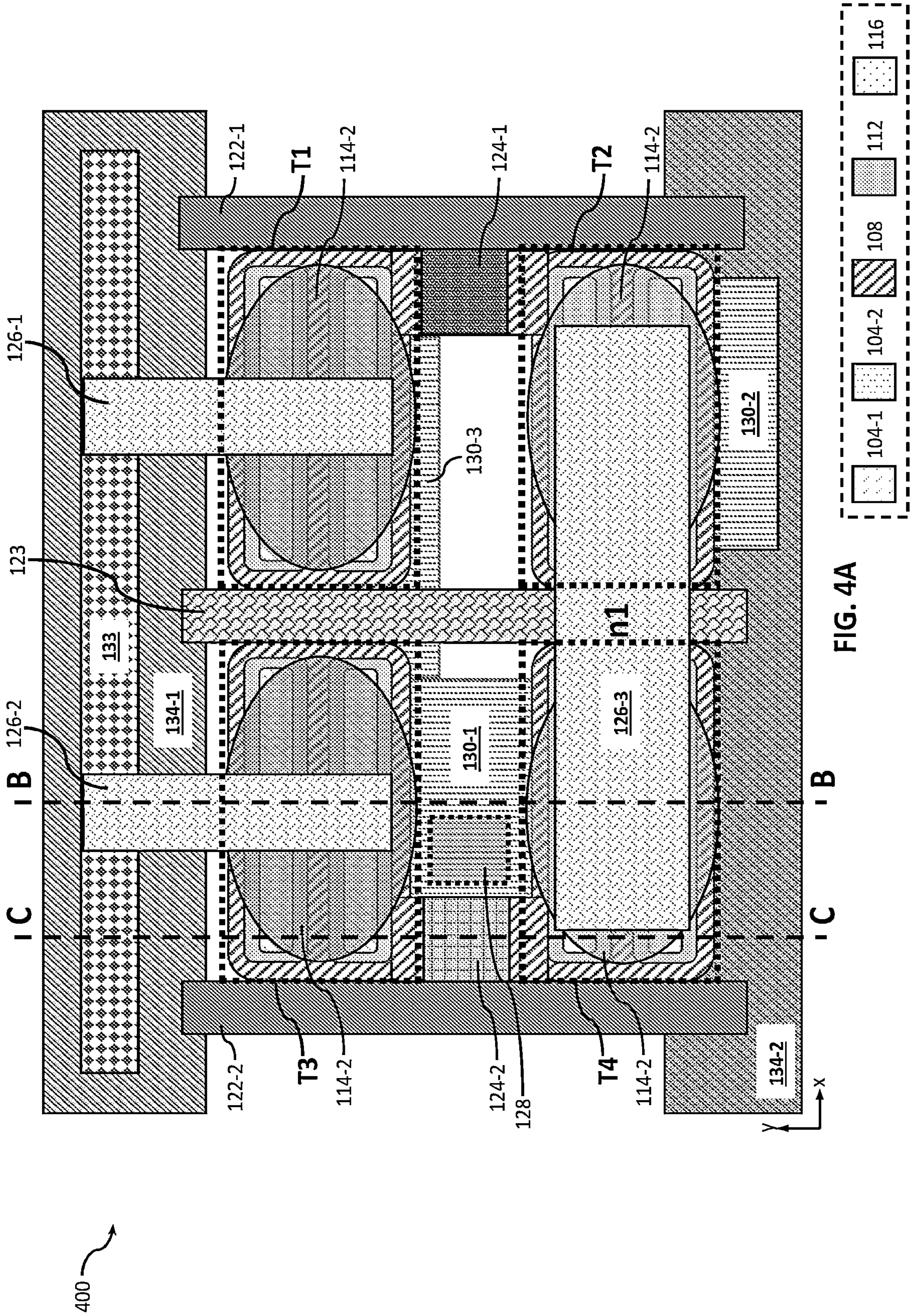
FIGS. 4A-4C provide top-down and cross-sectional side views of an IC device implementing a two-input NAND circuit using vertical transistors with backside S/D regions, in accordance with some embodiments.
Figure 4B:
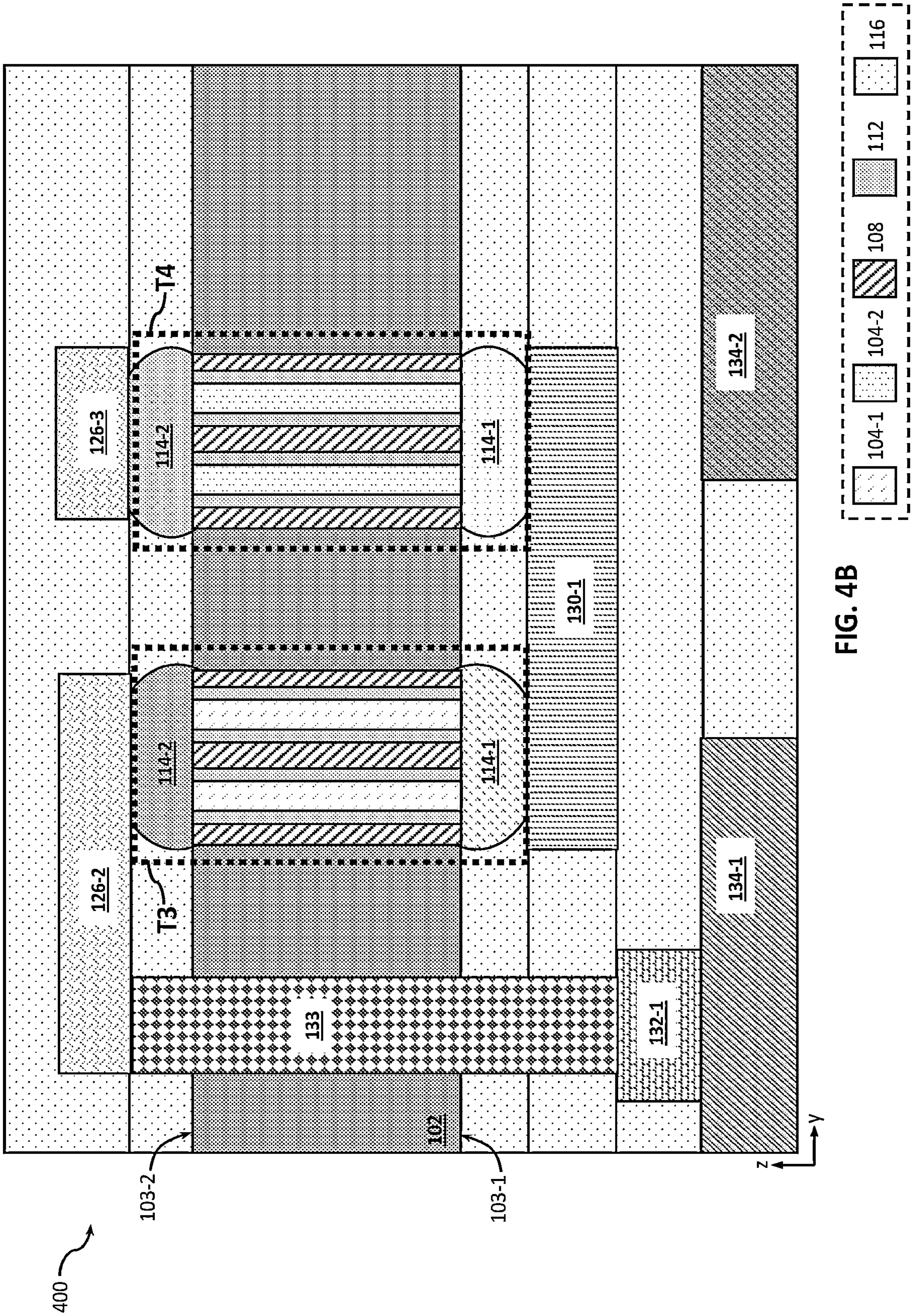
Figure 4C:
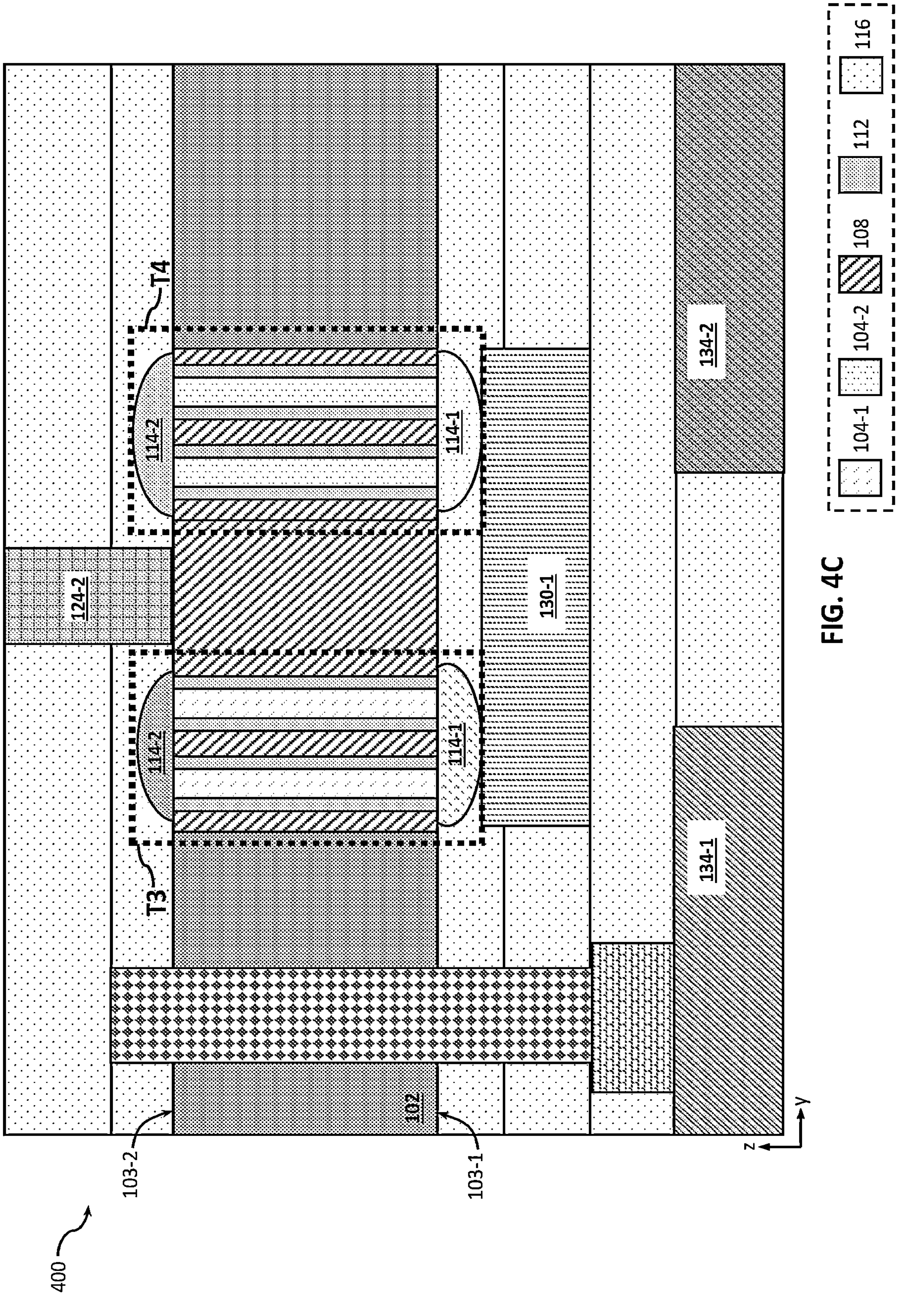
Figure 5A:
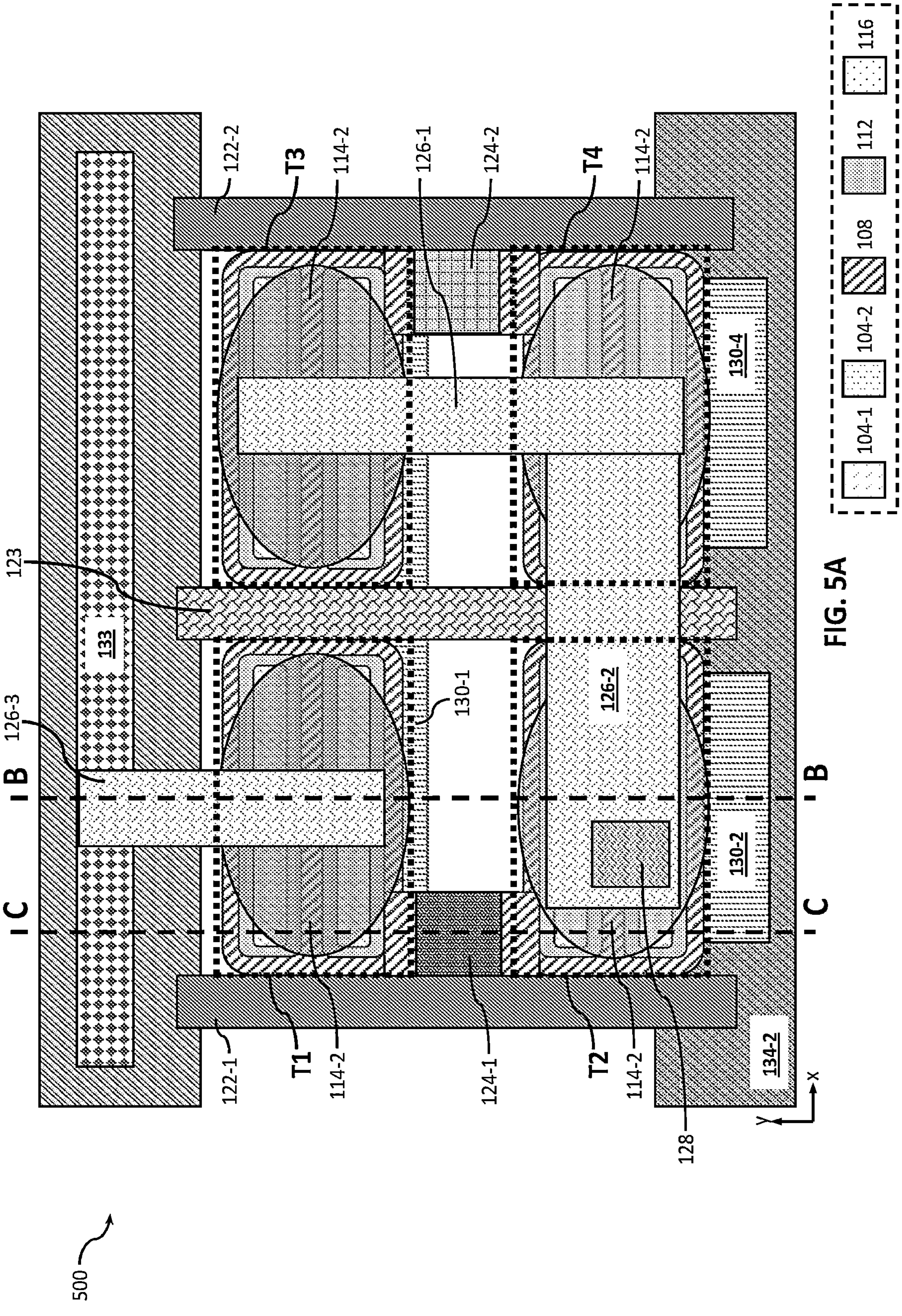
FIGS. 5A-5C provide top-down and cross-sectional side views of an IC device implementing a two-input NOR circuit using vertical transistors with backside S/D regions, in accordance with some embodiments.
Figure 5B:
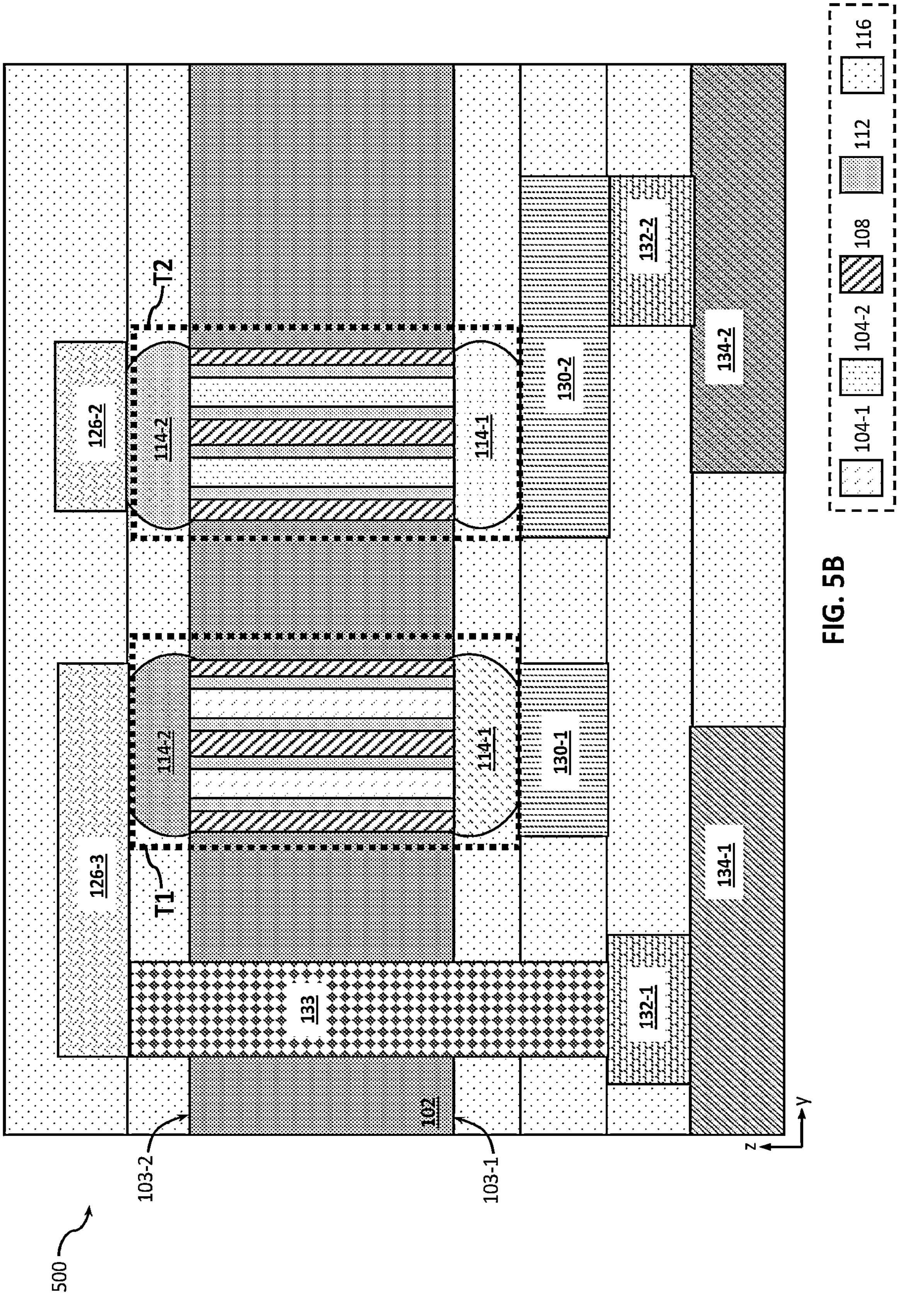
Figure 5C:
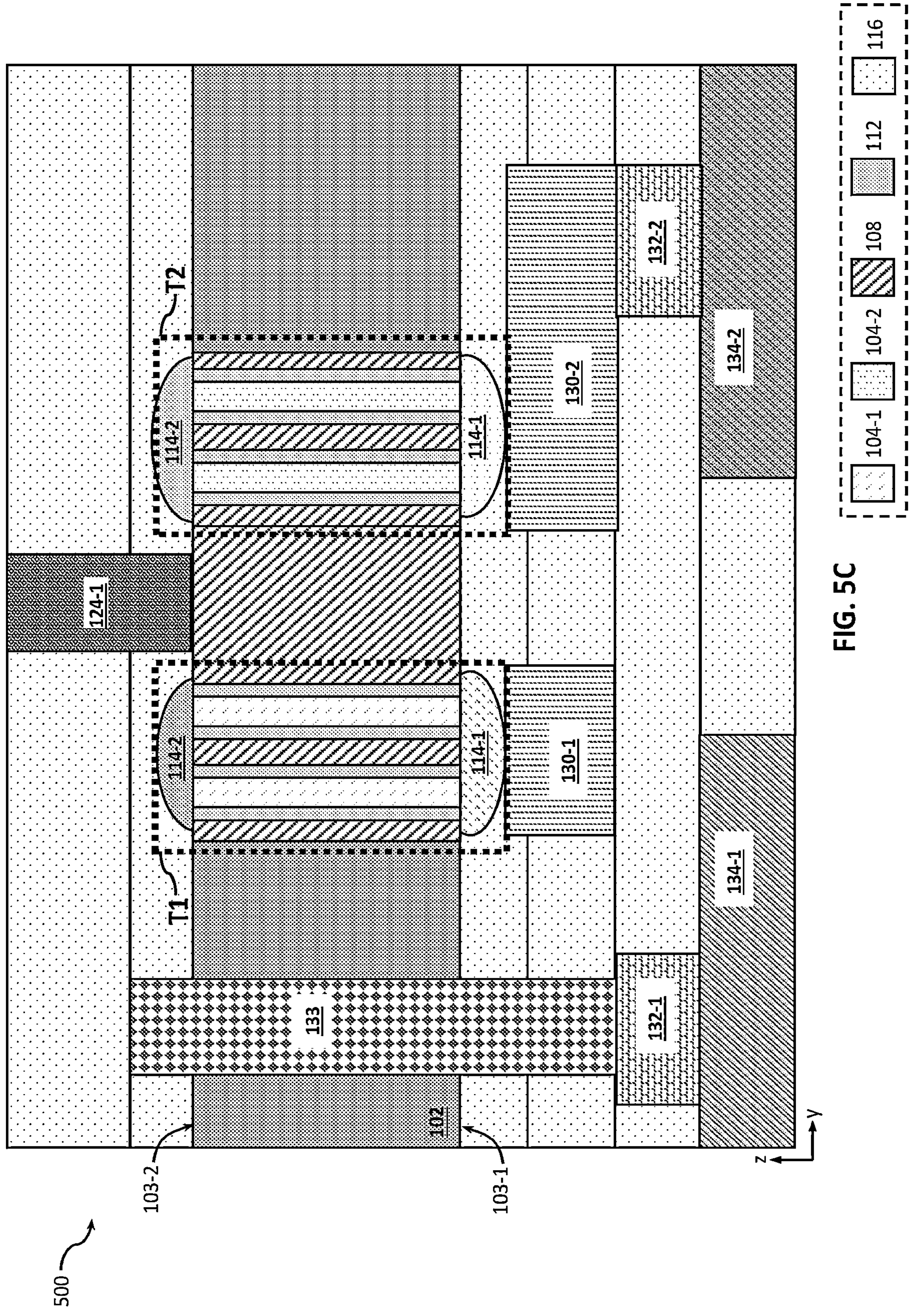

Any of the transistors T1-T4 of the logic circuits 100A-100D may be vertical transistors with backside S/D regions as described herein. Further details of implementing the logic circuits 100A-100D with all of the transistors T1-T4 being vertical transistors with backside S/D regions are shown in FIGS. 2-5, illustrating top-down views of various layers of IC devices implementing different logic circuits 100A-100D and, therefore, some illustrations of FIGS. 2-5 provide labels for the transistors T1-T4 of FIGS. 1A-1D. In particular, FIGS. 2A-2C provide top-down and cross-sectional side views of an IC device 200 implementing a two-legged inverter circuit 100A of FIG. 1A where each of the transistors T1-T4 is a vertical transistor with a backside S/D region, in accordance with some embodiments; FIGS. 3A-3C provide top-down and cross-sectional side views of an IC device 300 implementing a buffer circuit 100B of FIG. 1B where each of the transistors T1-T4 is a vertical transistor with a backside S/D region, in accordance with some embodiments; FIGS. 4A-4C provide top-down and cross-sectional side views of an IC device 400 implementing a two-input NAND circuit 100C of FIG. 1C where each of the transistors T1-T4 is a vertical transistor with a backside S/D region, in accordance with some embodiments; and FIGS. 5A-5C provide top-down and cross-sectional side views of an IC device 500 implementing a two-input NOR circuit 100D of FIG. 1D where each of the transistors T1-T4 is a vertical transistor with a backside S/D region, in accordance with some embodiments. Therefore, various connections of these example logic circuits are explained below with reference to both the electrical circuit diagrams of FIGS. 1A-1D, and the actual physical layouts of the IC devices of FIGS. 2-5. Logic circuits illustrated in FIGS. 1-5 provide some examples of IC devices with logic circuits using vertical transistors with backside S/D regions as described herein. In further embodiments, IC devices may implement other logic circuits using vertical transistors with backside S/D regions as described herein, as well as circuits other than logic circuits (e.g., memory circuits, RF circuits, analog circuits, or any other circuits in which one or more transistors may be implemented as vertical transistors with backside S/D regions as described herein), or any combination of various types of circuits.

In FIGS. 2-5, each of FIGS. 2A, 3A, 4A, and 5A illustrates a cross-sectional top-down view of an IC device, with a cross-section taken along the plane AA of, respectively, FIGS. 2B, 3B, 4B, and 5B. Each of FIGS. 2B, 3B, 4B, and 5B illustrates a cross-sectional side view of an IC device, with a cross-section taken along the plane BB of, respectively, FIGS. 2A, 3A, 4A, and 5A. Each of FIGS. 2C, 3C, 4C, and 5C illustrates a cross-sectional side view of an IC device, with a cross-section taken along the plane CC of, respectively, FIGS. 2A, 3A, 4A, and 5A. A number of elements labeled in FIGS. 2-5 with reference numerals are indicated in these drawings with different patterns in order to not clutter the drawings with too many reference numerals, with a legend showing the correspondence between the reference numerals and patterns being provided within a dashed box at the bottom of these drawings. For example, the legend illustrates that FIGS. 2-5 use different patterns to show N-type elongated structures 104-1 (e.g., elongated structures where the semiconductor material of the channel regions of transistors is an N-type semiconductor material), P-type elongated structures 104-2 (e.g., elongated structures where the semiconductor material of the channel regions of transistors is a P-type semiconductor material), a gate electrode material 106, a gate dielectric 112, etc. The top-down views of the IC devices shown in FIGS. 2-5 are intended to show relative arrangements of some of the components therein, and the IC devices of FIGS. 2-5, or portions thereof, may include other components that are not illustrated. For example, although not specifically illustrated in FIGS. 2-5, the IC devices shown in these drawings may include additional vertical transistors, gate spacers as known in the art, etc. In another example, although not specifically illustrated in FIGS. 2-5, at least portions of the elongated elements of the IC devices shown in these drawings may be surrounded in an insulator material, such as any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the IC devices of FIGS. 2-5 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

Each of FIGS. 2-5 illustrates four transistors, T1-T4, where each transistor is enclosed by a dotted box labeled with the respective identifier of the transistor (e.g., T1, T2, etc.). The transistors T1-T4 are vertical transistors, which can be seen in the cross-sectional side views (i.e., FIGS. 2B-2C) showing a support structure 102 having a back side 103-1 and an opposing front side 103-2 and showing that the elongated structures 104 that form the channel regions of the transistors T1-T4 extend between the back side 103-1 and the front side 103-2. Transistors T2 and T4 are N-type transistors and, thus, their channel regions are formed by the N-type elongated structures 104-1. Transistors T1 and T3 are P-type transistors and, thus, their channel regions are formed by the P-type elongated structures 104-2. In FIGS. 2-5, each of the transistors is shown to have two elongated structures 104 of the same type in order to provide a larger capacity for current through the transistor. Such a pair of the elongated structures 104 of a given transistor is shown in FIGS. 2-5 to be enclosed by a gate stack that includes at least a gate electrode material 108 and, optionally, also a gate insulator material 112 (e.g., as can be seen in the cross-sectional top-down view of FIGS. 2-5). However, in other embodiments of the IC device 200, different ones of the transistors T1-T4 may include any number of elongated structures enclosed by a gate stack of the transistor. FIGS. 2A-2C further illustrate a first S/D region 114-1 at the back side 103-1 and a second S/D region 114-2 at the front side 103-2 of the support structure 102. Each S/D region 114 may be enclosed in a layer of an insulator material 116 provided on the back and front sides 103 of the support structure 102.

Implementations of the present disclosure may be formed or carried out on any suitable support structure 102, such as a substrate, a die, a wafer, or a chip. The support structure 102 may, e.g., be the wafer 2000 of FIG. 6, discussed below, and may be, or be included in, a die, e.g., the singulated die 2002 of FIG. 6, discussed below. The support structure 102 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (e.g., materials from groups III and V of the periodic system of elements), group II-VI (e.g., materials from groups II and IV of the periodic system of elements), or group IV materials (e.g., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which an IC device with logic circuits using vertical transistors with backside S/D regions as described herein may be built falls within the spirit and scope of the present disclosure. As used herein, the term "support structure" does not necessarily mean that it provides mechanical support for the IC devices/structures (e.g., transistors, capacitors, interconnects, and so on) built thereon. For example, some other structure (e.g., a carrier substrate or a package substrate) may provide such mechanical support and the support structure 102 may provide material "support" in that, e.g., the IC devices/structures are build based on the semiconductor materials of the support structure 102. However, in some embodiments, the support structure 102 may provide mechanical support.

In some embodiments, the elongated structures 104 may take the form of a nanowire or nanoribbon, for example. In some embodiments, an area of a transverse cross-section of the elongated structure 104 (e.g., an area in the x-y plane of the example coordinate system x-y-z shown in FIGS. 2-5) may be between about 25 and 10000 square nanometers, including all values and ranges therein (e.g., between about 25 and 1000 square nanometers, or between about 25 and 500 square nanometers). The transverse cross-section of the elongated structure 104 is cross-section along a plane perpendicular to a longitudinal axis 120 of the elongated structure 104, where the longitudinal axis 120 may, e.g., be along the z-axis of the example coordinate system shown in FIGS. 2-5. In some embodiments, a width of the elongated structure 104 (e.g., a dimension measured in a plane parallel to the support structure 102 and in a direction perpendicular to the longitudinal axis 120, e.g., along the x-axis of the example coordinate system shown FIGS. 2-5) may be at least about 3 times larger than a thickness of the elongated structure 104 (e.g., a dimension measured in a plane parallel to the support structure 102 and perpendicular to the width, e.g., along the y-axis of the example coordinate system shown in FIGS. 2-5), including all values and ranges therein, e.g., at least about 4 times larger, or at least about 5 times larger.

Although the elongated structures 104 are illustrated in FIGS. 2-5 is shown as having a rectangular cross-section, each of the elongated structures 104 may instead have a cross-section that is rounded at corners or otherwise irregularly shaped, and the gate stack may conform to the shape of the elongated structures 104. The terms "back end" and "front end" of an elongated structure 104 may refer to the faces of the elongated structure 104 that are substantially parallel to the support structure 102 and are at, respectively, the back side 103-1 and the front side 103-2 of the support structure 102. The term "sidewall" of an elongated structure 104 may refer to the boundaries of the elongated structure 104 that are between the back side 103-1 and the front side 103-2 of the support structure 102 and extend in a direction of the longitudinal axis 120 of the elongated structure 104.

The elongated structures 104 may be formed of one or more semiconductor materials, together referred to as a "channel material." In general, channel materials of any of the vertical transistors described herein, e.g., the channel material of the transistors T1-T4, may be composed of semiconductor material systems including, for example, N-type or P-type materials systems. In some embodiments, the channel material may include a substantially monocrystalline semiconductor, such as silicon (Si) or germanium (Ge). In some embodiments, the channel material may include a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a combination of semiconductor materials.

For some example N-type transistor embodiments (e.g., for the embodiments where one of the vertical transistors described herein is an N-type metal-oxide-semiconductor (NMOS) transistor), the channel material may include a III-V material having a relatively high electron mobility, such as, but not limited to InGaAs, InP, InSb, and InAs. For some such embodiments, the channel material may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). For some example P-type transistor embodiments (e.g., for the embodiments where one of the vertical transistors described herein is a P-type metal-oxide-semiconductor (PMOS) transistor), the channel material may advantageously be a group IV material having a high hole mobility, such as, but not limited to Ge or a Ge-rich SiGe alloy. For some example embodiments, the channel material may have a Ge content between 0.6 and 0.9, and advantageously may be at least 0.7.

In some embodiments, the channel material may be a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors. IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

In some embodiments, any of the vertical transistors described herein may be a thin-film transistor (TFT). A TFT is a special kind of a FET made by depositing active semiconductor material over a support (e.g., a support structure as described above) that may be a non-conducting support. Some such materials may be deposited at relatively low temperatures, which allows depositing them within the thermal budgets imposed on back-end fabrication to avoid damaging the front-end components such as the logic devices of an IC device in which the transistor may be included. Thus, in some embodiments, the channel material of any of the vertical transistors described herein may be a semiconductor material deposited at relatively low temperatures, and may include any of the oxide semiconductor materials described above.

In other embodiments, instead of being deposited at relatively low temperatures as described above with reference to the TFTs, the channel material of any of the vertical transistors described herein may be epitaxially grown in what typically involves relatively high-temperature processing. In such embodiments, the channel material may include any of the semiconductor materials described above, including oxide semiconductor materials. In some such embodiments, the channel material may be epitaxially grown directly on a semiconductor layer of a support structure over which the transistor will be fabricated, in a process known as "monolithic integration." In other such embodiments, the channel material of any of the vertical transistors described herein may be epitaxially grown on a semiconductor layer of another support structure and then the epitaxially grown layer of the channel material may be transferred, in a process known as a "layer transfer," to a support structure over which the transistor will reside, in which case the latter support structure may but does not have to include a semiconductor layer prior to the layer transfer. Layer transfer advantageously allows forming transistors over support structures or in layers that do not include semiconductor materials (e.g., in the back end of an IC device). Layer transfer also advantageously allows forming transistors without imposing the negative effects of the relatively high-temperature epitaxial growth process on devices that may already be present over a support structure.

A channel material that is deposited at relatively low temperatures is typically a polycrystalline, polymorphous, or amorphous semiconductor, or any combination thereof. A channel material that is epitaxially grown is typically a highly crystalline (e.g., monocrystalline or single-crystalline) material. Therefore, whether the channel material of any of the vertical transistors described herein is deposited at relatively low temperatures or epitaxially grown can be identified by inspecting grain size of the active portions of the channel material (e.g., of the portions of the channel material that form channels of transistors). An average grain size of a channel material of any of the vertical transistors described herein being between about 0.5 and 1 millimeters (in which case the material may be polycrystalline) or smaller than about 0.5 millimeter (in which case the material may be polymorphous or amorphous) may be indicative of the channel material having been deposited (e.g., in which case the transistors in which such a channel material is included are TFTs). On the other hand, an average grain size of a channel material of any of the vertical transistors described herein being equal to or greater than about 1 millimeter (in which case the material may be a single-crystal material) may be indicative of the channel material having been epitaxially grown and included in the final device either by monolithic integration or by layer transfer.

In some embodiments, the channel material of any of the vertical transistors described herein may include a two-dimensional (2D) semiconductor material, e.g., a semiconductor material with a thickness of a few nanometers or less, where electrons in the material are free to move in the 2D plane but their restricted motion in the third direction is governed by quantum mechanics. In some such embodiments, such a channel material may include a single atomic monolayer of a 2D semiconductor material, while, in other such embodiments, such a channel material may include five or more atomic monolayers of a 2D semiconductor material. Examples of 2D materials that may be used to implement the channel material of any of the vertical transistors described herein include, but are not limited to, graphene, hexagonal boron nitride, or transition-metal chalcogenides.

A gate stack including a gate electrode material 108 and, optionally, a gate insulator 112, may wrap entirely or almost entirely around a portion of each of the elongated structures 104 as shown in FIGS. 2-5, with the channel region of each of the vertical transistors T1-T4 being the active region (channel region) of the channel material in the portion of the elongated structures 104 wrapped by the gate stack. As shown in FIGS. 2-5, the gate insulator 112 may wrap around a transversal portion/cross-section of the elongated structure 104, and the gate electrode material 108 may wrap around the gate insulator 112.

The gate electrode material 108 may include at least one P-type work function metal or N-type work function metal, depending on whether a transistor (e.g., any of the vertical transistors described herein) is a PMOS transistor or an NMOS transistor. P-type work function metal may be used as the gate electrode material 108 when the transistor is a PMOS transistor and N-type work function metal may be used as the gate electrode material 108 when the transistor is an NMOS transistor. For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate insulator 112 may include one or more high-k dielectrics including any of the materials discussed above with reference to the insulator material that may surround portions of the IC devices of FIGS. 2-5. In some embodiments, an annealing process may be carried out on the gate insulator 112 during manufacture of any of the vertical transistors described herein to improve the quality of the gate insulator 112. The gate insulator 112 may have a thickness that may, in some embodiments, be between about 0.5 nanometers and 3 nanometers, including all values and ranges therein (e.g., between about 1 and 3 nanometers, or between about 1 and 2 nanometers), although, in other embodiments, the thickness of the gate insulator 112 may be greater than 3 nanometers. In some embodiments, the gate stack may be surrounded by a gate spacer, not shown in FIGS. 2-5. Such a gate spacer could be configured to provide separation between the gate stacks of adjacent vertical transistors and could be made of a low-k dielectric material, some examples of which have been provided above. A gate spacer may include pores or air gaps to further reduce its dielectric constant.

In some embodiments, the S/D regions 114 of the vertical transistors T1-T4 of FIGS. 2-5 may be highly doped, e.g., with dopant concentrations of about $10^{21}$ dopants per cubic centimeter, in order to advantageously form Ohmic contacts with the respective S/D electrodes, although these regions may also have lower dopant concentrations and may form Schottky contacts in some implementations. Irrespective of the exact doping levels, the S/D regions of a transistor may be the regions having dopant concentration higher than in other regions, e.g., higher than a dopant concentration in the channel region (e.g., in a channel material extending between the first S/D region 114-1 and the second S/D region 114-2), and, therefore, may be referred to as "highly doped" (HD) regions. The channel region of any of the vertical transistors described herein may include semiconductor materials with doping concentrations significantly smaller than those of the S/D regions 114. In various embodiments, the S/D regions 114 of any of the vertical transistors described herein may include dopants such as boron, aluminum, antimony, phosphorous, or arsenic to form the source and drain regions. The first regions 114-1 are shown in FIGS. 2B-2C using different patterns to indicate that, in some embodiments, material compositions of the first regions 114-1 of P-type transistors (e.g., the transistors T1 and T3 shown in the drawings) may be different from those of N-type transistors (e.g., the transistors T2 and T2 shown in the drawings). The same applies to the second regions 114-2 shown in FIGS. 2B-2C. In some embodiments, a distance between the first and second S/D regions 114 (e.g., a dimension measured along the longitudinal axis 120 of the elongated structure 104) of a given vertical transistor may be between about 5 and 40 nanometers, including all values and ranges therein (e.g., between about 22 and 35 nanometers, or between about 20 and 30 nanometers).

Figure 1A:
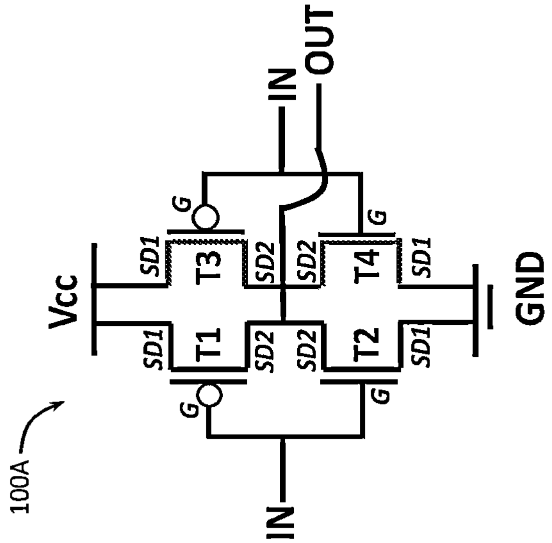

Turning to the details of the first example logic circuit, shown in FIG. 1A, the two-legged inverter circuit 100A may include an input terminal IN coupled to (e.g., directly connected to) the gates G of the transistors T1 and T2 and also coupled to (e.g., directly connected to) the gates G of the transistors T3 and T4. The two-legged inverter circuit 100A may further include a Vcc terminal coupled to (e.g., directly connected to) the first S/D terminals SD1 of each of the transistors T1 and T3, and a ground (GND) terminal coupled to (e.g., directly connected to) the first S/D terminals SD1 of each of the transistors T2 and T4. The two-legged inverter circuit 100A may also include an output terminal OUT coupled to (e.g., directly connected to) the second S/D terminals SD2 of each of the transistors T1-T4.

FIGS. 2A-2C provide top-down and cross-sectional side views of an IC device 200 implementing a two-legged inverter circuit 100A of FIG. 1A, in accordance with some embodiments. As shown in FIGS. 2A-2C, to connect the gates of the transistors T1-T4 to the input terminal IN, a plurality of gate interconnects (e.g., lines and vias) may be included in the IC device 200. For example, a plurality of gate lines 122 may be provided to be in conductive contacts with the gate electrode materials 108 of different ones of the transistors T1-T4. As shown in FIG. 2A, a first gate line 122-1 may have portions that are in conductive contact with the gate electrode material 108 of the transistors T1 and T2, while a second gate line 122-1 may have portions that are in conductive contact with the gate electrode material 108 of the transistors T3 and T4. In some embodiments, one or more IN vias 124 may be provided to be in conductive contacts with one or more of the gate lines 122 to provide connectivity to the input terminal IN of the two-legged inverter circuit 100A. As shown in FIG. 2A, a first IN via 124-1 (also shown in FIG. 2C) may have a portion that is in conductive contact with the first gate line 122-1, while a second IN via 124-2 may have a portion that is in conductive contact with the second gate line 122-2. In other embodiments, the first and second instances gate lines 122-1, 122-2 may be omitted if, e.g., the first IN via 124-1 has portions that are in conductive contact with the gate electrode material 108 of the transistors T1 and T2 (as is shown in FIG. 2A), and the second IN via 124-2 has portions that are in conductive contact with the gate electrode material 108 of the transistors T3 and T4 (as is also shown in FIG. 2A). In some embodiments, a third gate line 122-3 may have portions that are in conductive contact with the gate electrode material 108 of all of the transistors T1-T4. In general, many other ways for electrically connecting the gates of the transistors T1-T4 to the input terminal IN of the two-legged inverter circuit 100A are possible and within the scope of the present disclosure.

Similarly, to connect the second S/D regions 114-2 of the transistors T1-T4 to the output terminal OUT, a plurality of second S/D region interconnects (e.g., lines and vias) may be included in the IC device 200. For example, a plurality of second S/D region lines 126 may be provided at the front side 103-2 of the support structure 102 to be in conductive contact with the second S/D regions 114-2 of different ones of the transistors T1-T4 of the IC device 200. Thus, the second S/D region lines 126 may be considered to be S/D electrodes for the second S/D regions 114-2 of the IC device 200. For example, a second S/D region line 126-1 (the one shown on the left of FIG. 2A, extending along the y-axis of the example coordinate system shown) may have portions that are in conductive contact with the second S/D regions 114-2 of the transistors T1 and T2, a second S/D region line 126-2 (the one shown on the right of FIG. 2A, also extending along the y-axis of the example coordinate system shown) may have portions that are in conductive contact with the second S/D regions 114-2 of the transistors T3 and T4, and a second S/D region line 126-3 (the one shown in the middle of FIG. 2A, extending along the x-axis of the example coordinate system shown) may have portions that are in conductive contact with the second S/D regions 114-2 of the transistors T1 and T3 and/or may have portions that are in conductive contact with the first and second instances of the second S/D region lines 126. In some embodiments, one or more OUT vias 128 may be provided to be in conductive contacts with one or more of the second S/D region lines 126 to provide connectivity to the output terminal OUT. For example, as shown in FIG. 2A and FIG. 2B, an OUT via 128 may have a portion that is in conductive contact with the second S/D region line 126-3. In general, many other ways for electrically connecting the second S/D regions of the transistors T1-T4 to the output terminal OUT of the two-legged inverter circuit 100A are possible and within the scope of the present disclosure.

Further, to connect the first S/D regions of the transistors T1-T4 to the respective reference potentials (e.g., the Vcc terminal and the GND terminal), a plurality of first S/D region interconnects (e.g., lines and vias) may be included in the IC device 200. For example, a plurality of first S/D region lines 130 may be provided at the back side 103-1 of the support structure 102 to be in conductive contact with the first S/D regions 114-1 of different ones of the transistors T1-T4. Thus, the first S/D region lines 130 may be considered to be S/D electrodes for the first S/D regions 114-1. For example, a first instance of the first S/D region line 130 (the one marked in FIGS. 2A-2C as 130-1) may have a portion that is in conductive contact with the first S/D region 114-1 of the transistors T1, while a second instance of the first S/D region line 130 (the one marked in FIGS. 2A-2C as 130-1) may have a portion that is in conductive contact with the first S/D region 114-1 of the transistor T2. Similarly, a third instance of the first S/D region line 130 (the one marked in FIGS. 2A-2C as 130-3) may have a portion that is in conductive contact with the first S/D region 114-1 of the transistors T3, while a fourth instance of the first S/D region line 130 (the one marked in FIGS. 2A-2C as 130-4) may have a portion that is in conductive contact with the first S/D region 114-1 of the transistor T4. In some embodiments, one or more first S/D region vias 132 may be provided to be in conductive contacts with one or more of the first S/D region lines 130 to provide connectivity to the Vcc terminal and the GND terminal. For example, as shown in FIG. 2B and FIG. 2C, the first S/D region via 132-1 may have a portion that is in conductive contact with the first S/D region line 130-1, connecting the first S/D region line 130-1 to a VCC line 134-1 to connect the first S/D terminals of the transistors T1 and T3 to the Vcc terminal. Similarly, as also shown in FIG. 2B and FIG. 2C, the first S/D region via 132-2 may have a portion that is in conductive contact with the first S/D region line 130-2, connecting the first S/D region line 130-2 to a GND line 134-2 to connect the first S/D terminals of the transistors T2 and T4 to the GND terminal. In general, many other ways for electrically connecting the first S/D regions of the transistors T1-T4 to the Vcc terminal and the GND terminal of the two-legged inverter circuit 100A are possible and within the scope of the present disclosure.

It should be noted that although FIG. 2A illustrates the second S/D region line 126-3 overlapping the third gate line 122-3, which may suggest that those lines are in conductive contact with one another, this is not the case. As the electric circuit diagram of the two-legged inverter circuit 100A illustrates, the input and the output terminals are not connected to one another. In the IC device 200, the second S/D region line 126-3 and the third gate line 122-3 may be in different layers, e.g., with respect to the back side 103-1 of the support structure 102. For example, the second S/D region line 126-3 may be in a layer of the insulator material 116 provided at the front side 103-2, while the third gate line 122-3 may be in a layer of the insulator material 116 provided at the back side 103-1 (e.g., in the same or a different layer of the insulator material 116 in which first S/D region interconnects are provided.

Turning to the details of the second example logic circuit, shown in FIG. 1B, the buffer circuit 100B may include an input terminal IN coupled to (e.g., directly connected to) the gates G of the transistors T1 and T2. The buffer circuit 100B may also include an output terminal OUT coupled to (e.g., directly connected to) the second S/D terminals SD2 of each of the transistors T3 and T4. Furthermore, the second S/D terminals SD2 of the transistors T1 and T2 may be coupled (e.g., directly connected) to one another and to the gates of the transistors T3 and T4, e.g., via an intermediate node n1. Similar to the two-legged inverter circuit 100A, the buffer circuit 100B may further include a Vcc terminal coupled to (e.g., directly connected to) the first S/D terminals SD1 of each of the transistors T1 and T3, and a GND terminal coupled to (e.g., directly connected to) the first S/D terminals SD1 of each of the transistors T2 and T4.

FIGS. 3A-3C provide top-down and cross-sectional side views of an IC device 300 implementing the buffer circuit 100B of FIG. 1B, in accordance with some embodiments. As shown in FIGS. 3A-3C, to connect the gates of the transistors T1 and T2 to the input terminal IN, and to connect the gates of the transistors T3 and T4 to one another and to the second S/D terminals SD2 of the transistor T1 and T2, a plurality of gate interconnects (e.g., lines and vias) may be included in the IC device 300. As shown in FIG. 3A, a first gate line 122-1 may have portions that are in conductive contact with the gate electrode material 108 of the transistors T1 and T2, while a second gate line 122-2 may have portions that are in conductive contact with the gate electrode material 108 of the transistors T3 and T4. As shown in FIG. 3A, an IN via 124 (also shown in FIG. 3C) may have a portion that is in conductive contact with the first gate line 122-1 and provide connectivity to the input terminal IN of the buffer circuit 100B. In other embodiments, the gate line 122-1 may be omitted if, e.g., the IN via 124 has portions that are in conductive contact with the gate electrode material 108 of the transistors T1 and T2 (as is shown in FIG. 3A).

Further, to connect various ones of the second S/D regions 114-2 of the transistors T1-T4, a plurality of second S/D region interconnects (e.g., lines and vias) may be included in the IC device 300. For example, a plurality of second S/D region lines 126 may be provided at the front side 103-2 of the support structure 102 to be in conductive contact with the second S/D regions 114-2 of different ones of the transistors T1-T4 of the IC device 300. Thus, the second S/D region lines 126 may be considered to be S/D electrodes for the second S/D regions 114-2 of the IC device 300. For example, a second S/D region line 126-1 (the one shown on the left of FIG. 3A, extending along the y-axis of the example coordinate system shown) may have portions that are in conductive contact with the second S/D regions 114-2 of the transistors T1 and T2, while a second S/D region line 126-2 (the one shown on the right of FIG. 3A, also extending along the y-axis of the example coordinate system shown) may have portions that are in conductive contact with the second S/D regions 114-2 of the transistors T3 and T4. As further shown in FIG. 3A, an OUT via 128 may have a portion that is in conductive contact with the second S/D region line 126-2 to provide connectivity to the output terminal OUT of the IC device 300. FIG. 3A further illustrates a S/D-to-gate line 129, which, in some embodiments, may extend along the x-axis of the example coordinate system shown. The S/D-to-gate line 129 may have a first portion that is in conductive contact with a first portion of an intermediate via 131 and a second portion that is in conductive contact with the gate line 122-2. A second portion of the intermediate via 131 may be in conductive contact with the second S/D region line 126-1. In this manner, the S/D-to-gate line 129, the intermediate via 131, the second S/D region line 126-1, and the gate line 122-2 may provide the intermediate node n1 that connects the second S/D regions 114-2 of the transistors T1 and T2 to the gates of the transistors T3 and T4 of the buffer circuit 100B. FIG. 3A further illustrates an insulator structure 123 that may be included in the IC device 300 to electrically insulate the gates of the transistors T1 and T3, as well as to insulate the gates of the transistors T2 and T4. In some embodiments, the insulator structure 123 may have a portion in the same plane as the gate lines 122 of the IC device 300. In some embodiments, the insulator structure 123 may extend vertically along the gates of the transistors T1-T4 in order to provide electrical isolation (e.g., in some embodiments, the insulator structure 123 may extend between the back side 103-1 and the front side 103-2 of the support structure 102). The insulator structure 123 may include any suitable electrically insulating material, such as any of the insulator materials described above.

Further, to connect the first S/D regions of the transistors T1-T4 to the respective reference potentials (e.g., the Vcc terminal and the GND terminal), a plurality of first S/D region interconnects (e.g., lines and vias) may be included in the IC device 300 similar to how it was described for the IC device 200. FIGS. 3A-3C illustrate the first S/D region lines 130, the first S/D region via 132, the VCC line 134-1, and the GND line 134-2 substantially as shown in FIGS. 2A-2C, and, therefore, in the interests of brevity, their descriptions are not repeated.

In general, many ways for electrically connecting various terminals of the transistors T1-T4 to various terminals of the buffer circuit 100B other than those shown in FIGS. 2A-2C are possible and within the scope of the present disclosure.

It should be noted that although FIG. 3A illustrates the S/D-to-gate line 129 overlapping the second S/D line 126-2, which may suggest that those lines are in conductive contact with one another, this is not the case. As the electric circuit diagram of the buffer circuit 100B illustrates, these lines are not connected to one another. In the IC device 300, the S/D-to-gate line 129 and the second S/D line 126-2 may be in different layers, e.g., with respect to the back side 103-1 of the support structure 102. For example, the S/D-to-gate line 129 may be further away from the front side 103-2 than the second S/D line 126-2.

Figure 1D:
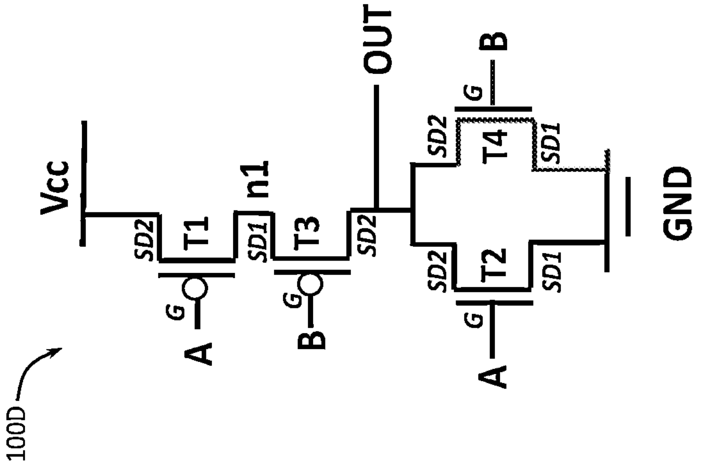
Figure 1C:
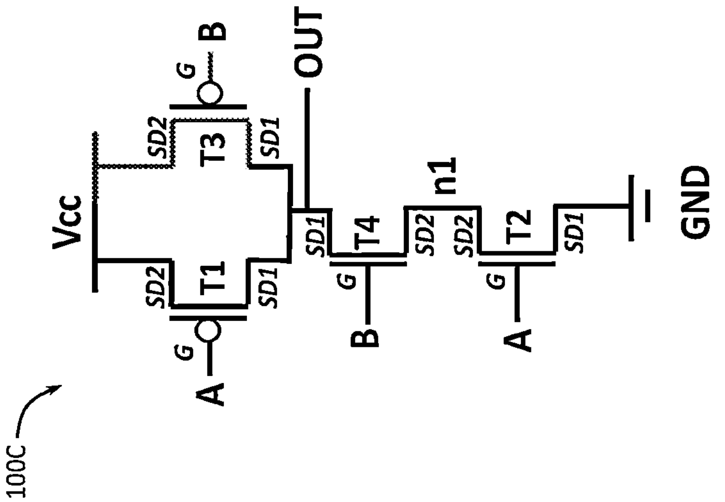

While the two-legged inverter circuit 100A and the buffer circuit 100B provide examples of logic circuits with a single input, the logic circuits shown in FIGS. 1C and 1D are examples of two-input logic circuits, where one input terminal is designated as an input terminal A and another input terminal is designated as an input terminal B. It should be noted that, while the general illustrations of FIGS. 1C and 1D are similar to those of FIGS. 1A and 1B, in FIGS. 1C and 1D, the designation of the first and second S/D regions SD1 and SD2 of the transistors T1 and T3 are reversed compared to the circuits shown in FIGS. 1A and 1B.

As shown in FIG. 1C, the two-input NAND circuit 100C may include a first input terminal A coupled to (e.g., directly connected to) the gates G of the transistors T1 and T2, and further include a second input terminal B, different from the first input terminal A, coupled to (e.g., directly connected to) the gates G of the transistors T3 and T4. Thus, the gates of the transistors T1 and T2 are coupled to (e.g., directly connected to) one another, via the first input terminal A, and, similarly, the gates of the transistors T3 and T4 are coupled to (e.g., directly connected to) one another, via the second input terminal B. The two-input NAND circuit 100C may further include an output terminal OUT coupled to (e.g., directly connected to) the first S/D terminals SD1 of each of the transistors T1 and T3 as well as to the first S/D terminal SD1 of the transistor T4, while the second S/D terminals SD2 of the transistors T2 and T4 are coupled together (e.g., via an intermediate node n1). The two-input NAND circuit 100C may further include a Vcc terminal coupled to (e.g., directly connected to) the second S/D terminals SD2 of each of the transistors T1 and T3, and a GND terminal coupled to (e.g., directly connected to) the first S/D terminal SD1 of the transistor T2.

FIGS. 4A-4C provide top-down and cross-sectional side views of an IC device 400 implementing the two-input NAND circuit 100C of FIG. 1C, in accordance with some embodiments. It should be noted that, while the general illustrations of FIG. 4 are similar to those of FIGS. 2, 3, and 5, in FIG. 4, the transistors T3 and T4 are shown on the left side and the transistors T1 and T2 are shown on the right side, opposite to the illustration of FIGS. 2, 3, and 5. Further, as described above, the designation of the first and second S/D regions SD1 and SD2 of the transistors T1 and T3 are reversed in the two-input NAND circuit 100C of FIG. 1C compared to the circuits 100A and 100B shown in FIGS. 1A and 1B.

As shown in FIGS. 4A-4C, to connect the gates of the transistors T1 and T2 to the input terminal A and to connect the gates of the transistors T3 and T4 to the input terminal B, a plurality of gate interconnects (e.g., lines and vias) may be included in the IC device 400. For example, a plurality of gate lines 122 may be provided to be in conductive contacts with the gate electrode materials 108 of different ones of the transistors T1-T4 of the IC device 400. As shown in FIG. 4A, a first gate line 122-1 may have portions that are in conductive contact with the gate electrode material 108 of the transistors T1 and T2, while a second gate line 122-2 may have portions that are in conductive contact with the gate electrode material 108 of the transistors T3 and T4. In some embodiments, different IN vias 124 may be provided to be in conductive contacts with respective gate lines 122 to provide connectivity to the input terminals A and B of the two-input NAND circuit 100C. As shown in FIG. 4A, a first input A via 124-1 may have a portion that is in conductive contact with the first gate line 122-1, while a second input B via 124-2 (also shown in FIG. 4C) may have a portion that is in conductive contact with the second gate line 122-2. In other embodiments, the first and second instances gate lines 122-1, 122-2 of the IC device 400 may be omitted if, e.g., the first IN via 124-1 has portions that are in conductive contact with the gate electrode material 108 of the transistors T1 and T2 (as is shown in FIG. 4A), and the second IN via 124-2 has portions that are in conductive contact with the gate electrode material 108 of the transistors T3 and T4 (as is also shown in FIG. 4A). In general, many other ways for electrically connecting the gates of the transistors T1-T2 and the transistors T3-T4 to, respectively, the input terminals A and B of the two-input NAND circuit 100C are possible and within the scope of the present disclosure. FIG. 4A further illustrates an insulator structure 123 that may be included in the IC device 400 to electrically insulate the gates of the transistors T1 and T3, as well as to insulate the gates of the transistors T2 and T4. In some embodiments, the insulator structure 123 may have a portion in the same plane as the gate lines 122 of the IC device 400. In some embodiments, the insulator structure 123 may extend vertically along the gates of the transistors T1-T4 in order to provide electrical isolation (e.g., in some embodiments, the insulator structure 123 may extend between the back side 103-1 and the front side 103-2 of the support structure 102). The insulator structure 123 may include any suitable electrically insulating material, such as any of the insulator materials described above.

A first S/D line 130-1 may be provided at the back side 103-1 of the support structure 102 and coupled to the first S/D regions 114-1 of the transistors T3 and T4. Another first S/D line 130-3 may be provided at the back side back side 103-1 of the support structure 102 and coupled to the first S/D regions 114-1 of the transistors T3 and T1, where the first S/D lines 130-1 and 130-3 may be electrically continuous or in conductive contact with one another. Thus, together, the first S/D lines 130-1 and 130-3 connect the first S/D regions 114-1 of the transistors T1, T3, and T4 in the IC device 400. An OUT via 128 may be provided in the IC device 400, where the OUT via 128 may have a portion that is in conductive contact with the first S/D line 130-1 to provide connectivity to the output terminal OUT. Because such an OUT via 128 would be provided at the back side 103-1 of the IC device 400, it would be obscured by the view of the first S/D line 130-1 and, therefore, is shown in FIG. 4A within a dotted contour labeled with the reference numeral 128. In general, many other ways for electrically connecting the first S/D regions 114-1 of the transistors T1, T3, and T4 to the output terminal OUT of the two-input NAND circuit 100C are possible and within the scope of the present disclosure.

Another first S/D line 130-2 may also be provided at the back side 103-1 of the support structure and coupled to the first S/D region 114-1 of the transistors T2. The first S/D line 130-2 may be coupled to a GND line 134-2 of the IC device 400, e.g., by means of a via 132-2 between the first S/D line 130-2 and the GND line 134-2 as was described with reference to FIG. 2, even though the via 132-2 is not shown in FIG. 4 because the cross-sectional side views of FIG. 4 do not show a cross-section of the transistor T2.

Connectivity to the Vcc terminal of the two-input NAND circuit 100C may be realized in the IC device 400 by means of a second S/D line 126-1 coupled (e.g., directly connected) to the second S/D region 114-2 of the transistor T1 and a second S/D line 126-2 coupled (e.g., directly connected) to the second S/D region 114-2 of the transistor T3. Each of the second S/D lines 126-1 and 126-2 may be coupled (e.g., directly connected) to an interconnect 133, which may further be coupled (e.g., directly connected) to a via 132-1 that is coupled (e.g., directly connected) a Vcc line 134-1 of the IC device 400. FIGS. 4A-4C further illustrate a second S/D line 126-3 coupled (e.g., directly connected) to the second S/D regions 114-2 of the transistors T2 and T4, which line represents the intermediate node n1 of the two-input NAND circuit 100C.

In general, many other ways for electrically connecting the first S/D regions of the transistors T1, T3, and T4 to the GND terminal and connecting the second S/D regions of the transistors T1 and T3 to the Vcc terminal of the two-input NAND circuit 100C are possible and within the scope of the present disclosure.

Turning to the last example of a logic circuit using vertical transistors with backside S/D regions, as shown in FIG. 1D, the two-input NOR circuit 100D may include a first input terminal A coupled to (e.g., directly connected to) the gates G of the transistors T1 and T2, and further include a second input terminal B, different from the first input terminal A, coupled to (e.g., directly connected to) the gates G of the transistors T3 and T4. Thus, the gates of the transistors T1 and T2 are coupled to (e.g., directly connected to) one another, via the first input terminal A, and, similarly, the gates of the transistors T3 and T4 are coupled to (e.g., directly connected to) one another, via the second input terminal B. The two-input NOR circuit 100D may further include an output terminal OUT coupled to (e.g., directly connected to) the second S/D terminals SD2 of each of the transistors T2-T4, while the first S/D terminals SD1 of the transistors T1 and T3 are coupled together (e.g., via an intermediate node n1). The two-input NOR circuit 100D may further include a Vcc terminal coupled to (e.g., directly connected to) the second S/D terminal SD2 of the transistor T1, and a GND terminal coupled to (e.g., directly connected to) the first S/D terminals SD1 of each of the transistors T2 and T4.

FIGS. 5A-5C provide top-down and cross-sectional side views of an IC device 500 implementing the two-input NOR circuit 100D of FIG. 1D, in accordance with some embodiments. As described above, the designation of the first and second S/D regions SD1 and SD2 of the transistors T1 and T3 are reversed in the two-input NOR circuit 100D of FIG. 1D compared to the circuits 100A and 100B shown in FIGS. 1A and 1B.

As shown in FIGS. 5A-5C, to connect the gates of the transistors T1 and T2 to the input terminal A and to connect the gates of the transistors T3 and T4 to the input terminal B, a plurality of gate interconnects (e.g., lines and vias) may be included in the IC device 500. For example, a plurality of gate lines 122 may be provided to be in conductive contacts with the gate electrode materials 108 of different ones of the transistors T1-T4 of the IC device 500. As shown in FIG. 5A, a first gate line 122-1 may have portions that are in conductive contact with the gate electrode material 108 of the transistors T1 and T2, while a second gate line 122-2 may have portions that are in conductive contact with the gate electrode material 108 of the transistors T3 and T4. In some embodiments, different IN vias 124 may be provided to be in conductive contacts with respective gate lines 122 to provide connectivity to the input terminals A and B of the two-input NOR circuit 100D. As shown in FIG. 5A, a first input A via 124-1 (also shown in FIG. 5C) may have a portion that is in conductive contact with the first gate line 122-1, while a second input B via 124-2 may have a portion that is in conductive contact with the second gate line 122-2. In other embodiments, the first and second instances gate lines 122-1, 122-2 of the IC device 500 may be omitted if, e.g., the first IN via 124-1 has portions that are in conductive contact with the gate electrode material 108 of the transistors T1 and T2 (as is shown in FIG. 4A), and the second IN via 124-2 has portions that are in conductive contact with the gate electrode material 108 of the transistors T3 and T4 (as is also shown in FIG. 4A). In general, many other ways for electrically connecting the gates of the transistors T1-T2 and the transistors T3-T4 to, respectively, the input terminals A and B of the two-input NOR circuit 100D are possible and within the scope of the present disclosure. FIG. 5A further illustrates an insulator structure 123 that may be included in the IC device 500 to electrically insulate the gates of the transistors T1 and T3, as well as to insulate the gates of the transistors T2 and T4. In some embodiments, the insulator structure 123 may have a portion in the same plane as the gate lines 122 of the IC device 500. In some embodiments, the insulator structure 123 may extend vertically along the gates of the transistors T1-T4 in order to provide electrical isolation (e.g., in some embodiments, the insulator structure 123 may extend between the back side 103-1 and the front side 103-2 of the support structure 102). The insulator structure 123 may include any suitable electrically insulating material, such as any of the insulator materials described above.

At the front side 103-2 of the support structure 102 of the IC device 500, a second S/D line 126-1 may be provided, coupled (e.g., directly connected) to the second S/D regions 114-2 of the transistors T3 and T4. Another second S/D line 126-2 may be provided at the front side 103-2 of the support structure 102 and coupled (e.g., directly connected) to the second S/D regions 114-2 of the transistors T2 and T4, where the second S/D lines 126-1 and 126-2 may be electrically continuous or in conductive contact with one another. Thus, together, the second S/D lines 126-1 and 126-2 connect the second S/D regions 114-2 of the transistors T2, T3, and T4 in the IC device 500. As further shown in FIG. 5A, an OUT via 128 may have a portion that is in conductive contact with the second S/D line 126-2 to provide connectivity to the output terminal OUT of the IC device 500. In general, many other ways for electrically connecting the second S/D regions 114-2 of the transistors T2, T3, and T4 to the output terminal OUT of the two-input NOR circuit 100D are possible and within the scope of the present disclosure.

Furthermore, a second S/D line 126-3 may also be provided at the front side 103-2 of the support structure 102 of the IC device 500, coupled (e.g., directly connected) to the second S/D region 114-2 of the transistor T1, to realize connectivity to the Vcc terminal of the two-input NOR circuit 100D. The second S/D line 126-3 may be coupled (e.g., directly connected) to an interconnect 133, which may further be coupled (e.g., directly connected) to a via 132-1 that is coupled (e.g., directly connected) a Vcc line 134-1 of the IC device 500, as is shown in FIG. 5B.

At the back side 103-1 of the support structure 102 of the IC device 500, a first S/D line 130-1 may be provided, coupled (e.g., directly connected) to the first S/D regions 114-1 of the transistors T1 and T3, which line represents the intermediate node n1 of the two-input NOR circuit 100D. Also at the back side 103-1 of the support structure 102 of the IC device 500, a first S/D line 130-2 may be provided, coupled (e.g., directly connected) to the first S/D region 114-1 of the transistor T2. Furthermore, a first S/D line 130-4 may also be provided at the back side 103-1 of the support structure 102 of the IC device 500, coupled (e.g., directly connected) to the first S/D region 114-1 of the transistor T4. The first S/D line 130-2 may be coupled to a GND line 134-2 of the IC device 500, e.g., by means of a via 132-2 between the first S/D line 130-2 and the GND line 134-2 as was described with reference to FIG. 2. Analogous applies to the first S/D line 130-4.

In general, many other ways for electrically connecting the first S/D regions of the transistors T2 and T4 to the GND terminal and connecting the first S/D regions of the transistor T1 to the Vcc terminal of the two-input NOR circuit 100D are possible and within the scope of the present disclosure.

Any of the vertical transistors with backside S/D regions and any of the circuits with such transistors described herein (e.g., as described with reference to FIGS. 1-5) may be used to implement any suitable components. For example, in various embodiments, transistors described herein may be part of one or more of: a central processing unit, a memory device (e.g., a high-bandwidth memory device), a memory cell, a logic circuit, input/output circuitry, a field programmable gate array (FPGA) component such as an FPGA transceiver or an FPGA logic, a power delivery circuitry, an amplifier (e.g., a III-V amplifier), Peripheral Component Interconnect Express (PCIE) circuitry, Double Data Rate (DDR) transfer circuitry, a computing device (e.g., a wearable or a handheld computing device), etc.

The IC devices with vertical transistors with backside S/D regions disclosed herein, e.g., the IC devices with logic circuits as described with reference to FIGS. 1-5, may be included in any suitable electronic device. FIGS. 6-10 illustrate various examples of apparatuses that may include one or more of the IC devices with vertical transistors with backside S/D regions disclosed herein, e.g., one or more IC devices with logic circuits using vertical transistors with backside S/D regions as described with reference to FIGS. 1-5.

Figure 6:
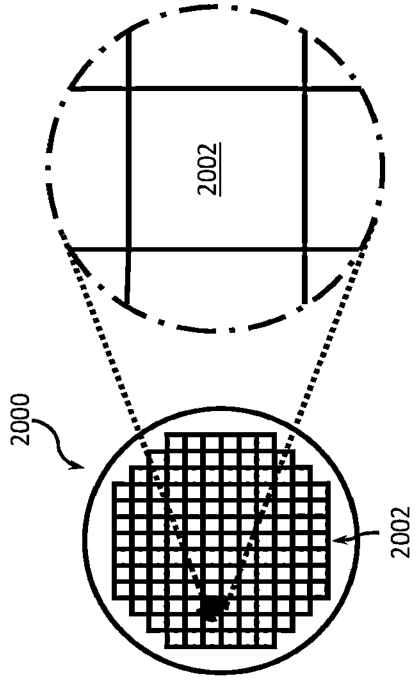
FIG. 6 provides top views of a wafer and dies that may include one or more logic circuits using vertical transistors with backside S/D regions in accordance with any of the embodiments disclosed herein.

FIG. 6 illustrates top views of a wafer 2000 and dies 2002 that may include one or more IC devices with vertical transistors with backside S/D regions in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 7. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more vertical transistors with backside S/D regions as described herein). After the fabrication of the semiconductor product is complete (e.g., after manufacture of any embodiment of the IC devices with vertical transistors with backside S/D regions as described herein), the wafer 2000 may undergo a singulation process in which each of the dies 2002 is separated from one another to provide discrete "chips" of the semiconductor product. In particular, devices that include one or more vertical transistors with backside S/D regions as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a hysteretic memory device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 9) or other logic that is configured to store information in the memory devices or execute instructions stored in the memory array.

Figure 7:
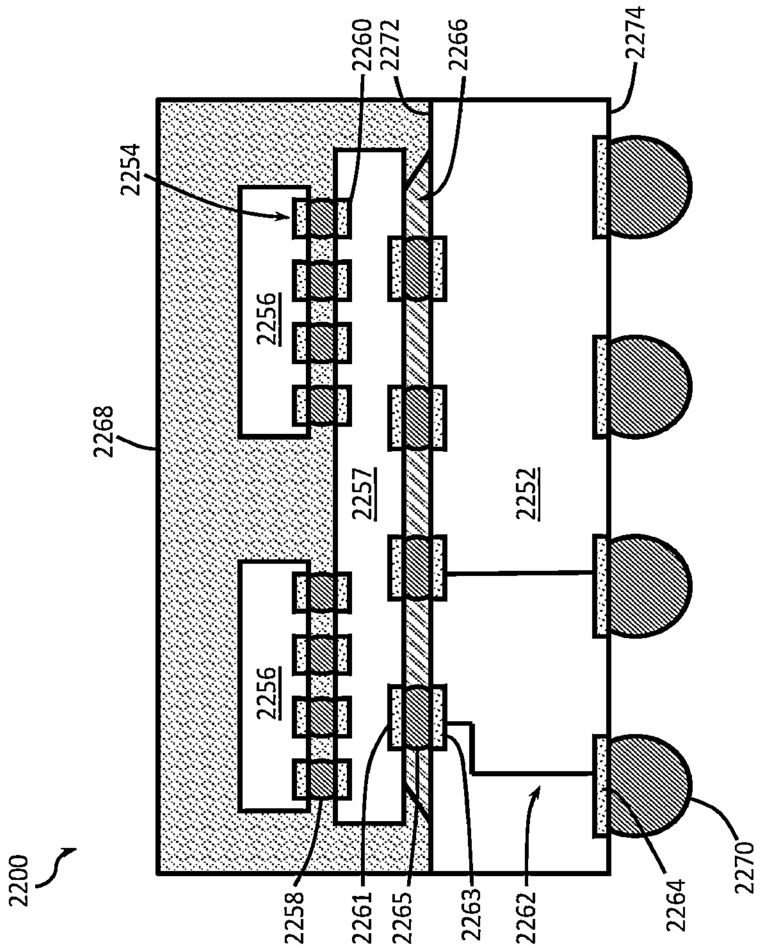
FIG. 7 is a cross-sectional side view of an IC package that may include one or more logic circuits using vertical transistors with backside S/D regions in accordance with any of the embodiments disclosed herein.

FIG. 7 is a side, cross-sectional view of an example IC package 2200 that may include one or more IC devices with vertical transistors with backside S/D regions in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 7 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 7 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 7 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 8.

The dies 2256 may take the form of any of the embodiments of the die 2002 discussed herein (e.g., may include any of the embodiments of the IC devices with vertical transistors with backside S/D regions as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high-bandwidth memory), including embedded memory dies as described herein. In some embodiments, any of the dies 2256 may include one or more IC devices with vertical transistors with backside S/D regions, e.g., as discussed above; in some embodiments, at least some of the dies 2256 may not include any IC devices with vertical transistors with backside S/D regions.

The IC package 2200 illustrated in FIG. 7 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 7, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 8:
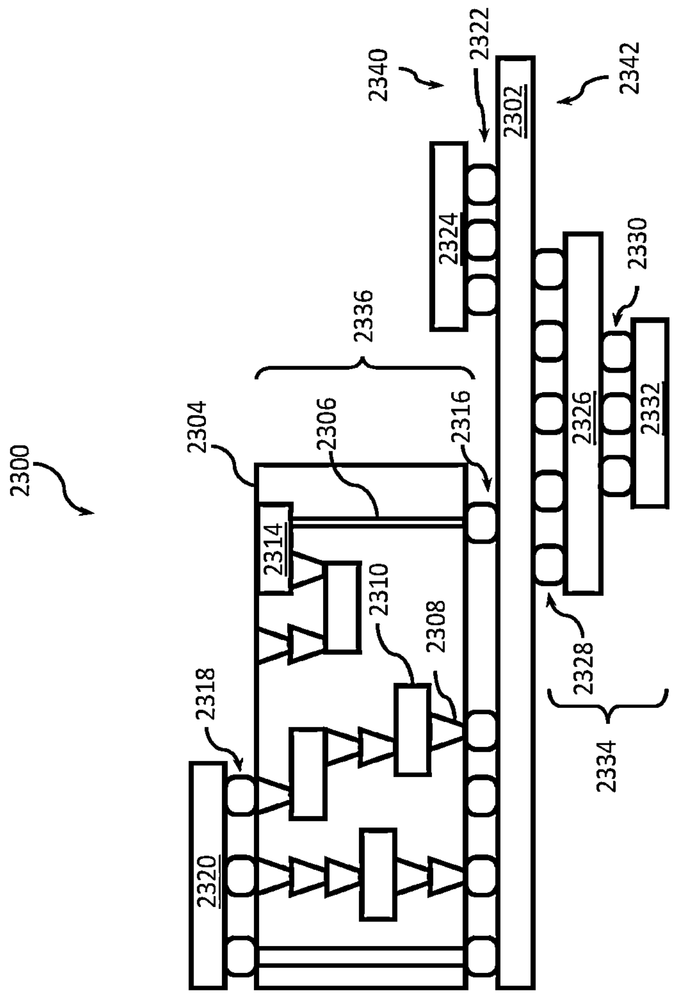
FIG. 8 is a cross-sectional side view of an IC device assembly that may include one or more logic circuits using vertical transistors with backside S/D regions in accordance with any of the embodiments disclosed herein.

FIG. 8 is a cross-sectional side view of an IC device assembly 2300 that may include components having one or more IC devices with vertical transistors with backside S/D regions in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices with vertical transistors with backside S/D regions in accordance with any of the embodiments disclosed herein; e.g., any of the IC packages discussed below with reference to the IC device assembly 2300 may take the form of any of the embodiments of the IC package 2200 discussed above with reference to FIG. 7 (e.g., may include one or more IC devices with vertical transistors with backside S/D regions provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 8 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 8), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6), an IC device, or any other suitable component. In particular, the IC package 2320 may include one or more IC devices with vertical transistors with backside S/D regions as described herein. Although a single IC package 2320 is shown in FIG. 8, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 8, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 8 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 9:
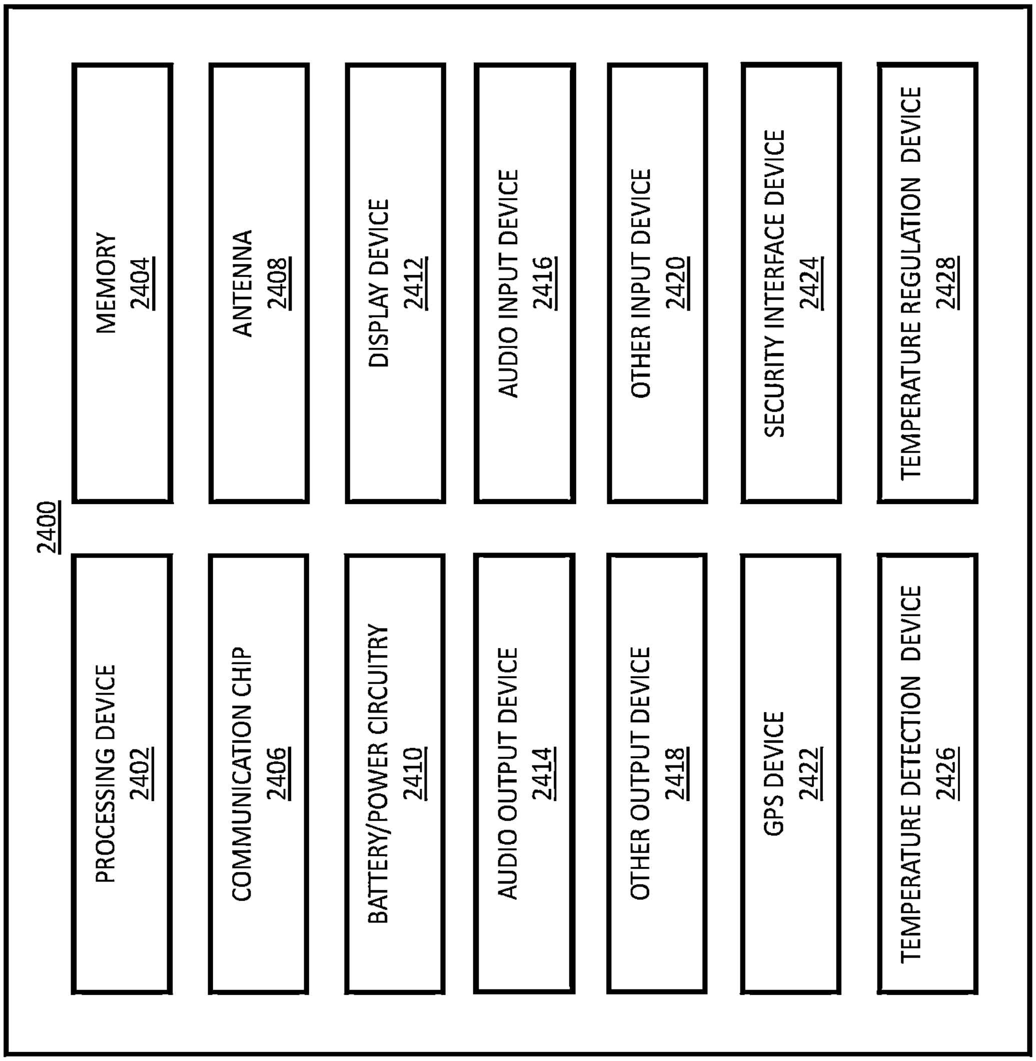
FIG. 9 is a block diagram of an example computing device that may include one or more logic circuits using vertical transistors with backside S/D regions in accordance with any of the embodiments disclosed herein.

FIG. 9 is a block diagram of an example computing device 2400 that may include one or more components including one or more IC devices with vertical transistors with backside S/D regions in accordance with any of the embodiments disclosed herein. For example, any suitable ones of the components of the computing device 2400 may include a die (e.g., the die 2002 of FIG. 6) having one or more vertical transistors with backside S/D regions as described herein. Any one or more of the components of the computing device 2400 may include, or be included in, an IC package 2200 of FIG. 7 or an IC device 2300 of FIG. 8.

A number of components are illustrated in FIG. 9 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 9, but the computing device 2400 may include interface circuitry for coupling to the one or more components. For example, the computing device 2400 may not include a display device 2412, but may include display device interface circuitry (e.g., a connector and driver circuitry) to which a display device 2412 may be coupled. In another set of examples, the computing device 2400 may not include an audio input device 2416 or an audio output device 2414, but may include audio input or output device interface circuitry (e.g., connectors and supporting circuitry) to which an audio input device 2416 or audio output device 2414 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded DRAM (eDRAM) or spin transfer torque MRAM.

In some embodiments, the computing device 2400 may include a communication chip 2406 (e.g., one or more communication chips). For example, the communication chip 2406 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2406 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2406 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2406 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2406 may operate in accordance with other wireless protocols in other embodiments. The computing device 2400 may include an antenna 2408 to facilitate wireless communications and/or to receive other wireless communications (such as AM or FM radio transmissions).

In some embodiments, the communication chip 2406 may manage wired communications, such as electrical, optical, or any other suitable communication protocols (e.g., the Ethernet). As noted above, the communication chip 2406 may include multiple communication chips. For instance, a first communication chip 2406 may be dedicated to shorter-range wireless communications such as Wi-Fi or Bluetooth, and a second communication chip 2406 may be dedicated to longer-range wireless communications such as global positioning system (GPS), EDGE, GPRS, CDMA, WiMAX, LTE, EV-DO, or others. In some embodiments, a first communication chip 2406 may be dedicated to wireless communications, and a second communication chip 2406 may be dedicated to wired communications.

The computing device 2400 may include a battery/power circuitry 2410. The battery/power circuitry 2410 may include one or more energy storage devices (e.g., batteries or capacitors) and/or circuitry for coupling components of the computing device 2400 to an energy source separate from the computing device 2400 (e.g., AC line power).

The computing device 2400 may include a display device 2412 (or corresponding interface circuitry, as discussed above). The display device 2412 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2414 (or corresponding interface circuitry, as discussed above). The audio output device 2414 may include any device that generates an audible indicator, such as speakers, headsets, or earbuds, for example.

The computing device 2400 may include an audio input device 2416 (or corresponding interface circuitry, as discussed above). The audio input device 2416 may include any device that generates a signal representative of a sound, such as microphones, microphone arrays, or digital instruments (e.g., instruments having a musical instrument digital interface (MIDI) output).

The computing device 2400 may include an other output device 2418 (or corresponding interface circuitry, as discussed above). Examples of the other output device 2418 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may include a GPS device 2422 (or corresponding interface circuitry, as discussed above). The GPS device 2422 may be in communication with a satellite-based system and may receive a location of the computing device 2400, as known in the art.

The computing device 2400 may include a security interface device 2424. The security interface device 2424 may include any device that provides security features for the computing device 2400 or for any individual components therein (e.g., for the processing device 2402 or for the memory 2404). Examples of security features may include authorization, access to digital certificates, access to items in keychains, etc. Examples of the security interface device 2424 may include a software firewall, a hardware firewall, an antivirus, a content filtering device, or an intrusion detection device.

In some embodiments, the computing device 2400 may include a temperature detection device 2426 and a temperature regulation device 2428.

The temperature detection device 2426 may include any device capable of determining temperatures of the computing device 2400 or of any individual components therein (e.g., temperatures of the processing device 2402 or of the memory 2404). In various embodiments, the temperature detection device 2426 may be configured to determine temperatures of an object (e.g., the computing device 2400, components of the computing device 2400, devices coupled to the computing device, etc.), temperatures of an environment (e.g., a data center that includes, is controlled by, or otherwise associated with the computing device 2400), and so on. The temperature detection device 2426 may include one or more temperature sensors. Different temperature sensors of the temperature detection device 2426 may have different locations within and around the computing device 2400. A temperature sensor may generate data (e.g., digital data) representing detected temperatures and provide the data to another device, e.g., to the temperature regulation device 2428, the processing device 2402, the memory 2404, etc. In some embodiments, a temperature sensor of the temperature detection device 2426 may be turned on or off, e.g., by the processing device 2402 or an external system. The temperature sensor detects temperatures when it is on and does not detect temperatures when it is off. In other embodiments, a temperature sensor of the temperature detection device 2426 may detect temperatures continuously and automatically or detect temperatures at predefined times or at times triggered by an event associated with the computing device 2400 or any components therein.

The temperature regulation device 2428 may include any device configured to change (e.g., decrease) temperatures, e.g., based on one or more target temperatures and/or based on temperature measurements performed by the temperature detection device 2426. A target temperature may be a preferred temperature. A target temperature may depend on a setting in which the computing device 2400 operates. In some embodiments, the target temperature may be 200 Kelvin degrees or lower. In some embodiments, the target temperature may be 20 Kelvin degrees or lower, or 5 Kelvin degrees or lower. Target temperatures for different objects and different environments of, or associated with, the computing device 2400 can be different. In some embodiments, cooling provided by the temperature regulation device 2428 may be a multi-stage process with temperatures ranging from room temperature to 4K or lower.

In some embodiments, the temperature regulation device 2428 may include one or more cooling devices. Different cooling device may have different locations within and around the computing device 2400. A cooling device of the temperature regulation device 2428 may be associated with one or more temperature sensors of the temperature detection device 2426 and may be configured to operate based on temperatures detected the temperature sensors. For instance, a cooling device may be configured to determine whether a detected ambient temperature is above the target temperature or whether the detected ambient temperature is higher than the target temperature by a predetermined value or determine whether any other temperature-related condition associated with the temperature of the computing device 2400 is satisfied. In response to determining that one or more temperature-related condition associated with the temperature of the computing device 2400 are satisfied (e.g., in response to determining that the detected ambient temperature is above the target temperature), a cooling device may trigger its cooling mechanism and start to decrease the ambient temperature. Otherwise, the cooling device does not trigger any cooling. A cooling device of the temperature regulation device 2428 may operate with various cooling mechanisms, such as evaporation cooling, radiation cooling, conduction cooling, convection cooling, other cooling mechanisms, or any combination thereof. A cooling device of the temperature regulation device 2428 may include a cooling agent, such as a water, oil, liquid nitrogen, liquid helium, etc. In some embodiments, the temperature regulation device 2428 may be, for example, a dilution refrigerator, a helium-3 refrigerator, or a liquid helium refrigerator. In some embodiments, the temperature regulation device 2428 or any portions thereof (e.g., one or more of the individual cooling devices) may be connected to the computing device 2400 in close proximity (e.g., less than about 1 meter) or may be provided in a separate enclosure where a dedicated heat exchanger (e.g., a compressor, a heating, ventilation, and air conditioning (HVAC) system, liquid helium, liquid nitrogen, etc.) may reside.

By maintaining the target temperatures, the energy consumption of the computing device 2400 (or components thereof) can be reduced, while the computing efficiency may be improved. For example, when the computing device 2400 (or components thereof) operates at lower temperatures, energy dissipation (e.g., heat dissipation) may be reduced. Further, energy consumed by semiconductor components (e.g., energy needed for switching transistors of any of the components of the computing device 2400) can also be reduced. Various semiconductor materials may have lower resistivity and/or higher mobility at lower temperatures. That way, the electrical current per unit supply voltage may be increased by lowering temperatures. Conversely, for the same current that would be needed, the supply voltage may be lowered by lowering temperatures. As energy corelates to the supply voltage, the energy consumption of the semiconductor components may lower too. In some implementations, the energy savings due to reducing heat dissipation and reducing energy consumed by semiconductor components of the computing device or components thereof may outweigh (sometimes significantly outweigh) the costs associated with energy needed for cooling.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 10:
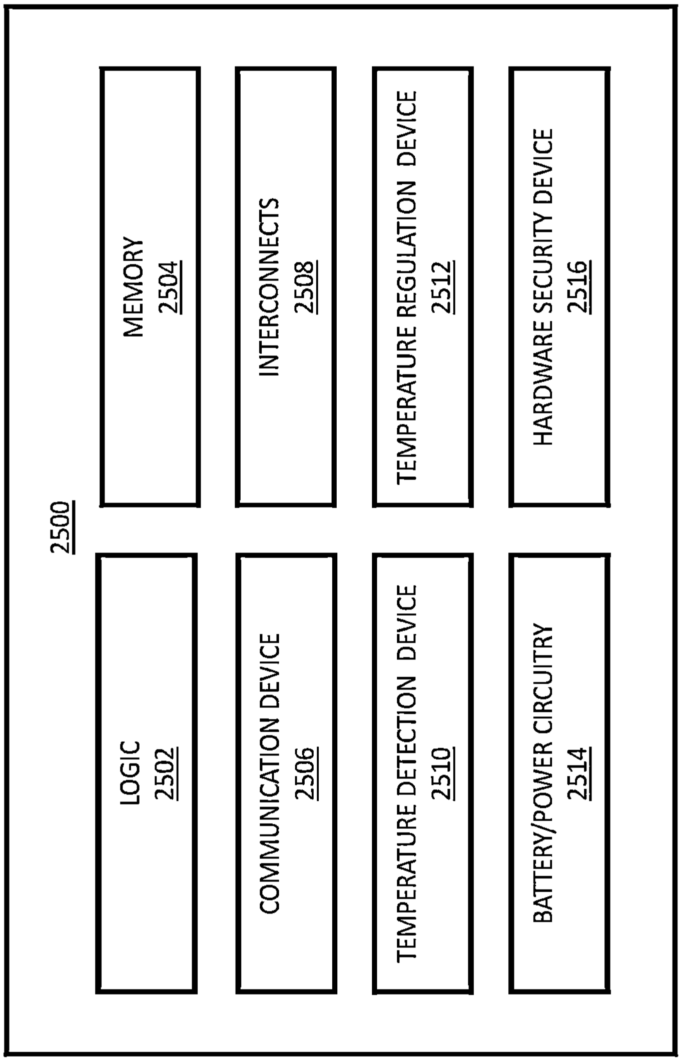
FIG. 10 is a block diagram of an example processing device that may include one or more logic circuits using vertical transistors with backside S/D regions in accordance with any of the embodiments disclosed herein.

FIG. 10 is a block diagram of an example processing device 2500 that may include one or more IC devices with vertical transistors with backside S/D regions in accordance with any of the embodiments disclosed herein. For example, any suitable ones of the components of the processing device 2500 may include a die (e.g., the die 2002 of FIG. 6) having one or more vertical transistors with backside S/D regions as described herein. Any one or more of the components of the processing device 2500 may include, or be included in, an IC device 2300 (FIG. 8). Any one or more of the components of the processing device 2500 may include, or be included in, an IC package 2200 of FIG. 7 or an IC device 2300 of FIG. 8. Any one or more of the components of the processing device 2500 may include, or be included in, a computing device 2400 of FIG. 9; for example, the processing device 2500 may be the processing device 2402 of the computing device 2400.

A number of components are illustrated in FIG. 10 as included in the processing device 2500, but any one or more of these components may be omitted or duplicated, as suitable for the application. In some embodiments, some or all of the components included in the processing device 2500 may be attached to one or more motherboards. In some embodiments, some or all of these components are fabricated on a single SoC die or coupled to a single support structure, e.g., to a single carrier substrate.

Additionally, in various embodiments, the processing device 2500 may not include one or more of the components illustrated in FIG. 10, but the processing device 2500 may include interface circuitry for coupling to the one or more components. For example, the processing device 2500 may not include a memory 2504, but may include display device interface circuitry (e.g., a connector and driver circuitry) to which a memory 2504 may be coupled.

The processing device 2500 may include logic circuitry 2502 (e.g., one or more circuits configured to implement logic/compute functionality). Examples of such circuits include ICs implementing one or more of input/output (I/O) functions, arithmetic operations, pipelining of data, etc.

In some embodiments, the logic circuitry 2502 may include one or more circuits responsible for read/write operations with respect to the data stored in the memory 2504. To that end, the logic circuitry 2502 may include one or more I/O ICs configured to control access to data stored in the memory 2504.

In some embodiments, the logic circuitry 2502 may include one or more high-performance compute dies, configured to perform various operations with respect to data stored in the memory 2504 (e.g., arithmetic and logic operations, pipelining of data from one or more memory dies of the memory 2504, and possibly also data from external devices/chips). In some embodiments, the logic circuitry 2502 may be configured to only control I/O access to data but not perform any operations on the data. In some embodiments, the logic circuitry 2502 may implement ICs configured to implement I/O control of data stored in the memory 2504, assemble data from the memory 2504 for transport (e.g., transport over a central bus) to devices/chips that are either internal or external to the processing device 2500, etc. In some embodiments, the logic circuitry 2502 may not be configured to perform any operations on the data besides I/O and assembling for transport to the memory 2504.

The processing device 2500 may include a memory 2504, which may include one or more ICs configure to implement memory circuitry (e.g., ICs implementing one or more of memory devices, memory arrays, control logic configured to control the memory devices and arrays, etc.). In some embodiments, the memory 2504 may be implemented substantially as described above with reference to the memory 2404 (FIG. 9). In some embodiments, the memory 2504 may be a designated device configured to provide storage functionality for the components of the processing device 2500 (e.g., local), while the memory 1604 may be configured to provide system-level storage functionality for the entire computing device 2400 (e.g., global). In some embodiments, the memory 2504 may include memory that shares a die with the logic circuitry 2502.

In some embodiments, the memory 2504 may include a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the memory 2504 may be a memory that is not divided into hierarchical layer or levels in terms of access of its data.

In some embodiments, the memory 2504 may include a hierarchical memory. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, e.g., the size and capabilities of each component. With hierarchical memory, each of the various memory components can be viewed as part of a hierarchy of memories ($m_1$, $m_2$, . . . , $m_n$) in which each member $m_i$ is typically smaller and faster than the next highest member $m_{i+1}$ of the hierarchy. To limit waiting by higher levels, a lower level of a hierarchical memory structure may respond by filling a buffer and then signaling for activating the transfer. For example, in some embodiments, the hierarchical memory implemented in the memory 2504 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory 2504 may be arranged.

The processing device 2500 may include a communication device 2506, which may be implemented substantially as described above with reference to the communication chip 2406 (FIG. 9). In some embodiments, the communication device 2506 may be a designated device configured to provide communication functionality for the components of the processing device 2500 (e.g., local), while the communication chip 2406 may be configured to provide system-level communication functionality for the entire computing device 2400 (e.g., global).

The processing device 2500 may include interconnects 2508, which may include any element or device that includes an electrically conductive material for providing electrical connectivity to one or more components of, or associated with, a processing device 2500 or/and between various such components. Examples of the interconnects 2508 include conductive lines/wires (also sometimes referred to as "lines" or "metal lines" or "trenches") and conductive vias (also sometimes referred to as "vias" or "metal vias"), metallization stacks, redistribution layers, metal-insulator-metal (MIM) structures, etc.

The processing device 2500 may include a temperature detection device 2510 which may be implemented substantially as described above with reference to the temperature detection device 2426 of FIG. 9 but configured to determine temperatures on a more local scale, e.g., of the processing device 2500 of components thereof. In some embodiments, the temperature detection device 2510 may be a designated device configured to provide temperature detection functionality for the components of the processing device 2500 (e.g., local), while the temperature detection device 2426 may be configured to provide system-level temperature detection functionality for the entire computing device 2400 (e.g., global).

The processing device 2500 may include a temperature regulation device 2512 which may be implemented substantially as described above with reference to the temperature regulation device 2428 of FIG. 9 but configured to regulate temperatures on a more local scale, e.g., of the processing device 2500 of components thereof. In some embodiments, the temperature regulation device 2512 may be a designated device configured to provide temperature regulation functionality for the components of the processing device 2500 (e.g., local), while the temperature regulation device 2428 may be configured to provide system-level temperature regulation functionality for the entire computing device 2400 (e.g., global).

The processing device 2500 may include a battery/power circuitry 2514 which may be implemented substantially as described above with reference to the battery/power circuitry 2410 of FIG. 9. In some embodiments, the battery/power circuitry 2514 may be a designated device configured to provide battery/power functionality for the components of the processing device 2500 (e.g., local), while the battery/power circuitry 2410 may be configured to provide system-level battery/power functionality for the entire computing device 2400 (e.g., global).

The processing device 2500 may include a hardware security device 2516 which may be implemented substantially as described above with reference to the security interface device 2424 of FIG. 9. In some embodiments, the hardware security device 2516 may be a physical computing device configured to safeguard and manage digital keys, perform encryption and decryption functions for digital signatures, authentication, and other cryptographic functions. In some embodiments, the hardware security device 2516 may include one or more secure cryptoprocessors chips.

The above description of illustrated implementations of the disclosure, including what is described in the Abstract, is not intended to be exhaustive or to limit the disclosure to the precise forms disclosed. Unless specified otherwise, in various embodiments, features described with respect to one of the drawings may be combined with those described with respect to other drawings.

The following paragraphs provide various examples of the embodiments disclosed herein.

Example 1 provides an IC device that includes a support structure (e.g., a die, a substrate, a carrier substrate, etc.) having a first face and an opposing second face; and one or more transistors, where an individual transistor includes a channel structure including a semiconductor material and extending between the first face and the second face of the support structure, a gate including a gate electrode material at least partially wrapping around the channel structure and surrounded by the support structure, a first doped region adjacent a portion of the channel structure at the first face of the support structure, and a second doped region adjacent a portion of the channel structure at the second face of the support structure.

Example 2 provides the IC device according to example 1, where the channel structure has a shape of a nanoribbon extending substantially vertically through the support structure.

Example 3 provides the IC device according to any one of examples 1-2, where the gate of the individual transistor further includes a gate insulator material at least partially wrapping around the channel structure, where the gate insulator material is between the channel structure and the gate electrode material.

Example 4 provides the IC device according to any one of examples 1-3, further including a layer of a first insulator material at the first face of the support structure and a layer of a second insulator material at the first face of the support structure, where, for the individual transistor, the first doped region is in the layer of the first insulator material and the second doped region is in the layer of the second insulator material.

Example 5 provides the IC device according to any one of examples 1-4, where the one or more transistors include a first transistor and a second transistor, and the IC device further includes a conductive line having a first portion in contact with the gate of the first transistor and having a second portion in contact with the gate of the second transistor.

Example 6 provides the IC device according to example 5, where the conductive line is substantially parallel to the support structure and is closer to the second face of the support structure than to the first face of the support structure.

Example 7 provides the IC device according to any one of examples 5-6, where the conductive line is a first conductive line, and the IC device further includes a second conductive line having a first portion in contact with the second doped region of the first transistor and having a second portion in contact with the second doped region of the second transistor.

Example 8 provides the IC device according to example 7, where the conductive line is substantially parallel to the support structure and is closer to the second face of the support structure than to the first face of the support structure.

Example 9 provides the IC device according to any one of examples 7-8, where the one or more transistors further include a third transistor, and the IC device further includes a third conductive line having a first portion in contact with the second doped region of the first transistor and having a second portion in contact with the second doped region of the third transistor.

Example 10 provides the IC device according to any one of examples 1-4, where the one or more transistors include a first transistor, a second transistor, a third transistor, and a fourth transistor, and the IC device further includes a first conductive line having a first portion in contact with the gate of the first transistor and having a second portion in contact with the gate of the second transistor, a second conductive line having a first portion in contact with the gate of the third transistor and having a second portion in contact with the gate of the fourth transistor, a third conductive line having a first portion in contact with the second doped region of the first transistor and having a second portion in contact with the second doped region of the second transistor, and a fourth conductive line having a first portion in contact with the second conductive line and having a second portion in contact with the third conductive line.

Example 11 provides the IC device according to example 10, where each of the first conductive line, the second conductive line, the third conductive line, and the fourth conductive line is substantially parallel to the support structure and is closer to the second face of the support structure than to the first face of the support structure.

Example 12 provides the IC device according to any one of examples 10-11, further including a first interconnect having a portion in contact with the first doped region of the first transistor, and a second interconnect having a portion in contact with the first doped region of the second transistor, where each of the first interconnect and the second interconnect is closer to the first face of the support structure than to the second face of the support structure.

Example 13 provides the IC device according to any one of examples 10-13, further including a buffer circuit, where the buffer circuit includes the first transistor, the second transistor, the third transistor, and the fourth transistor.

Example 14 provides the IC device according to any one of examples 1-4, where the one or more transistors include a first transistor, a second transistor, a third transistor, and a fourth transistor, and the IC device further includes a first conductive line having a first portion in contact with the gate of the first transistor and having a second portion in contact with the gate of the second transistor, a second conductive line having a first portion in contact with the gate of the third transistor and having a second portion in contact with the gate of the fourth transistor, a third conductive line having a first portion in contact with the second doped region of the second transistor and having a second portion in contact with the second doped region of the fourth transistor, and a fourth conductive line having a first portion in contact with the first doped region of the third transistor and having a second portion in contact with the first doped region of the fourth transistor.

Example 15 provides the IC device according to example 14, where each of the first conductive line, the second conductive line, and the third conductive line is substantially parallel to the support structure and is closer to the second face of the support structure than to the first face of the support structure, and the fourth conductive line is closer to the first face of the support structure than to the second face of the support structure.

Example 16 provides the IC device according to any one of examples 14-15, further including a two-input NAND circuit, where the two-input NAND circuit includes the first transistor, the second transistor, the third transistor, and the fourth transistor.

Example 17 provides an IC device that includes a substrate having a first face and an opposing second face; a plurality of transistors including a first transistor, a second transistor, a third transistor, and a fourth transistor, where an individual transistor includes a channel structure including a semiconductor material and extending between the first face and the second face of the substrate, a gate including a gate electrode material at least partially wrapping around the channel structure and surrounded by the substrate, a first doped region adjacent a portion of the channel structure at the first face of the substrate, and a second doped region adjacent a portion of the channel structure at the second face of the substrate; a first conductive line connecting the gate of the first transistor and the gate of the second transistor; a second conductive line connecting the gate of the third transistor and the gate of the fourth transistor; a third conductive line connecting the second doped region of the second transistor and the second doped region of the fourth transistor; and a fourth conductive line in contact with the first doped region of the second transistor.

Example 18 provides the IC device according to example 17, where each of the first conductive line, the second conductive line, and the third conductive line is substantially parallel to the substrate and is closer to the second face of the substrate than to the first face of the substrate, and the fourth conductive line is closer to the first face of the substrate than to the second face of the substrate.

Example 19 provides an IC device that includes a substrate and a logic circuitry including a plurality of transistors, each transistor having a vertical channel region extending between a first face of the substrate and an opposing second face of the substrate, a first region of a pair of a source region and a drain region of the transistor at the first face of the substrate, and a second region of the pair at the second face of the substrate. The IC device further includes a plurality of first interconnects in contact with the first region of one or more of the plurality of transistors and a plurality of second interconnects in contact with the second region of one or more of the plurality of transistors, where the first interconnects are closer to the first face of the substrate than to the second face of the substrate and the second interconnects are closer to the second face of the substrate than to the first face of the substrate.

Example 20 provides the IC device according to example 19, where the logic circuitry includes one or more of a two-legged inverter circuitry, a buffer circuitry, a two-input NAND circuitry, and a two-input NOR circuitry.

Example 21 provides the IC device according to any one of the preceding examples, where the IC device includes or is a part of a central processing unit.

Example 22 provides the IC device according to any one of the preceding examples, where the IC device includes or is a part of a memory device, e.g., a high-bandwidth memory device.

Example 23 provides the IC device according to any one of the preceding examples, where the IC device further includes a plurality of memory cells, each of the memory cells including a storage element.

Example 24 provides the IC device according to example 23, where the storage element is one of a capacitor, a magnetoresistive material, a ferroelectric material, or a resistance-changing material.

Example 25 provides the IC device according to any one of the preceding examples, where the IC device includes or is a part of a logic circuit.

Example 26 provides the IC device according to any one of the preceding examples, where the IC device includes or is a part of input/output circuitry.

Example 27 provides the IC device according to any one of the preceding examples, where the IC device includes or is a part of an FPGA transceiver.

Example 28 provides the IC device according to any one of the preceding examples, where the IC device includes or is a part of an FPGA logic.

Example 29 provides the IC device according to any one of the preceding examples, where the IC device includes or is a part of a power delivery circuitry.

Example 30 provides the IC device according to any one of the preceding examples, where the IC device includes or is a part of a III-V amplifier.

Example 31 provides the IC device according to any one of the preceding examples, where the IC device includes or is a part of PCIE circuitry or DDR transfer circuitry.

Example 32 provides an IC package that includes a die comprising an IC device according to any one of the preceding examples; and a further IC component, coupled to the die.

Example 33 provides the IC package according to example 32, where the further IC component includes one of a package substrate, an interposer, or a further IC support structure.

Example 34 provides a computing device that includes a carrier substrate and an IC device, coupled to the carrier substrate, where the IC device is an IC device according to any one of the preceding examples, or the IC device is included in the IC package according to any one of examples 32-33.

Example 35 provides the computing device according to example 34, where the computing device is a wearable or handheld computing device.

Example 36 provides the computing device according to examples 34 or 35, where the computing device further includes one or more communication chips and an antenna.

Example 37 provides the computing device according to any one of examples 34-36, where the carrier substrate is a motherboard.

Example 38 provides a method of manufacturing an IC device, the method including providing the IC device according to any one of the preceding examples.

The invention claimed is:

1. An integrated circuit (IC) device, comprising:
- a substrate having a first face and an opposing second face;
- a layer of an insulator material at the first face of the substrate; and
- one or more transistors, where an individual transistor of the one or more transistors includes:
  - a channel structure comprising a semiconductor material and extending between the first face and the second face of the substrate,
  - a first doped region in the layer of the insulator material and adjacent a portion of the channel structure at the first face of the substrate, and
  - a second doped region adjacent a portion of the channel structure at the second face of the substrate.

2. The IC device according to claim 1, wherein the channel structure has a shape of a nanoribbon extending substantially vertically through the substrate.

3. The IC device according to claim 1, wherein:
- the one or more transistors include a first transistor and a second transistor, and
- the IC device further includes a conductive line having a first portion in contact with a gate of the first transistor and having a second portion in contact with athe gate of the second transistor.

4. The IC device according to claim 3, wherein the conductive line is substantially parallel to the substrate and is closer to the second face of the substrate than to the first face of the substrate.

5. The IC device according to claim 3, wherein:
- the conductive line is a first conductive line, and
- the IC device further includes a second conductive line having a first portion in contact with a second doped region of the first transistor and having a second portion in contact with a second doped region of the second transistor.

6. The IC device according to claim 5, wherein the conductive line is substantially parallel to the substrate and is closer to the second face of the substrate than to the first face of the substrate.

7. The IC device according to claim 5, wherein:
- the one or more transistors further include a third transistor, and
- the IC device further includes a third conductive line having a first portion in contact with the second doped region of the first transistor and having a second portion in contact with a second doped region of the third transistor.

8. The IC device according to claim 1, wherein:
- the one or more transistors include a first transistor, a second transistor, a third transistor, and a fourth transistor, and
- the IC device further includes:
  - a first conductive line having a first portion in contact with a gate of the first transistor and having a second portion in contact with a gate of the second transistor,
  - a second conductive line having a first portion in contact with a gate of the third transistor and having a second portion in contact with a gate of the fourth transistor,
  - a third conductive line having a first portion in contact with a second doped region of the first transistor and having a second portion in contact with a second doped region of the second transistor, and
  - a fourth conductive line having a first portion in contact with the second conductive line and having a second portion in contact with the third conductive line.

9. The IC device according to claim 8, wherein each of the first conductive line, the second conductive line, the third conductive line, and the fourth conductive line is substantially parallel to the substrate and is closer to the second face of the substrate than to the first face of the substrate.

10. The IC device according to claim 9, further comprising a first interconnect having a portion in contact with a first doped region of the first transistor, and a second interconnect having a portion in contact with a first doped region of the second transistor, wherein each of the first interconnect and the second interconnect is closer to the first face of the substrate than to the second face of the substrate.

11. The IC device according to claim 8, further comprising a buffer circuit, wherein the buffer circuit includes the first transistor, the second transistor, the third transistor, and the fourth transistor.

12. The IC device according to claim 1, wherein:
- the one or more transistors include a first transistor, a second transistor, a third transistor, and a fourth transistor, and
- the IC device further includes:
  - a first conductive line having a first portion in contact with a gate of the first transistor and having a second portion in contact with a gate of the second transistor,
  - a second conductive line having a first portion in contact with a gate of the third transistor and having a second portion in contact with a gate of the fourth transistor,
  - a third conductive line having a first portion in contact with a second doped region of the second transistor and having a second portion in contact with a second doped region of the fourth transistor, and
  - a fourth conductive line having a first portion in contact with a first doped region of the third transistor and having a second portion in contact with a first doped region of the fourth transistor.

13. The IC device according to claim 12, wherein:

each of the first conductive line, the second conductive line, and the third conductive line is substantially parallel to the substrate and is closer to the second face of the substrate than to the first face of the substrate, and the fourth conductive line is closer to the first face of the substrate than to the second face of the substrate.

14. The IC device according to claim 1, wherein the insulator material is a first insulator material, and therein the IC device further includes:

a layer of a second insulator material at the second face of the substrate, wherein the second doped region is in the layer of the second insulator material.

15. The IC device according to claim 1, wherein the individual transistor further includes:

a gate comprising a gate electrode material at least partially wrapping around the channel structure and surrounded by the substrate.

16. The IC device according to claim 15, wherein the gate of the individual transistor further includes a gate insulator material at least partially wrapping around the channel structure, wherein the gate insulator material is between the channel structure and the gate electrode material.

17. An integrated circuit (IC) device, comprising:

a substrate; and a logic circuitry comprising a plurality of transistors, each transistor of the plurality of transistors comprising:

a vertical channel region extending from a top face of the substrate to a bottom face of the substrate, a first region of a pair of a source region and a drain region of the each transistor above the top face of the substrate, and a second region of the pair below the bottom face of the substrate;

one or more first interconnects in contact with the first region of one or more of the plurality of transistors; and one or more second interconnects in contact with the second region of one or more of the plurality of transistors, wherein the one or more first interconnects are closer to the top face of the substrate than to the bottom face of the substrate, and wherein the one or more second interconnects are closer to the bottom face of the substrate than to the top face of the substrate.

18. The IC device according to claim 17, wherein the logic circuitry includes a two-legged inverter circuitry.

19. The IC device according to claim 17, wherein the logic circuitry includes a buffer circuitry.

20. The IC device according to claim 17, wherein the logic circuitry includes a two-input NAND circuitry.

21. The IC device according to claim 17, wherein the logic circuitry includes a two-input NOR circuitry.

22. The IC device according to claim 17, further comprising:

a layer of a first material above the top face of the substrate; and a layer of a second material below the bottom face of the substrate, wherein:

the first region is in the layer of the first material, and the second region is in the layer of the second material.

23. The IC device according to claim 22, wherein at least one of the first material and the second material is an insulator material.

* * * * *